(12) United States Patent
Hirota et al.

(10) Patent No.: US 8,283,227 B2
(45) Date of Patent: Oct. 9, 2012

(54) METHOD FOR MANUFACTURING SEMICONDUCTOR MEMORY DEVICE

(75) Inventors: Toshiyuki Hirota, Tokyo (JP);
Takakazu Kiyomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/282,814

(22) Filed: Oct. 27, 2011

(65) Prior Publication Data
US 2012/0115300 A1    May 10, 2012

(30) Foreign Application Priority Data
Nov. 8, 2010 (JP) ................................. 2010-249791

(51) Int. Cl.
*H01L 21/8242* (2006.01)
(52) U.S. Cl. ........ 438/239; 438/250; 438/253; 438/393; 438/396; 257/E21.021
(58) Field of Classification Search .................. 438/239, 438/244, 250, 253, 381, 386, 393, 396, 685; 257/E21.008, E21.021
See application file for complete search history.

(56) References Cited

U.S. PATENT DOCUMENTS

| 7,425,493 | B2 * | 9/2008 | Yoon et al. ..................... 438/396 |
| 7,696,553 | B2 * | 4/2010 | Nakamura et al. ............. 257/300 |
| 7,851,324 | B2 * | 12/2010 | Wang et al. .................... 438/386 |
| 8,084,804 | B2 * | 12/2011 | Lee ................................ 257/310 |
| 2002/0190294 | A1 * | 12/2002 | Iizuka et al. ................... 257/296 |
| 2011/0169132 | A1 * | 7/2011 | Yamamoto et al. ............ 257/532 |

FOREIGN PATENT DOCUMENTS

| JP | 2002-373945 | 12/2002 |
| JP | 2003-174096 | 6/2003 |
| JP | 2004-064091 | 2/2004 |
| JP | 2006-041060 | 2/2006 |
| JP | 2006-135339 | 5/2006 |
| WO | WO2009/090979 | 7/2009 |

* cited by examiner

*Primary Examiner* — Tuan N. Quach
(74) *Attorney, Agent, or Firm* — Young & Thompson

(57) ABSTRACT

In a method for manufacturing a semiconductor memory device, a three dimensional lower electrode including a titanium nitride film is formed on a semiconductor substrate, and a dielectric film is formed on the surface of the lower electrode. After a first upper electrode is formed at a temperature that the crystal of the dielectric film is not grown on the surface of the dielectric film, the first upper electrode and the dielectric film are heat-treated at a temperature that the crystal of the dielectric film is grown to convert at least a portion of the dielectric film into a crystalline state. Thereafter, a second upper electrode is formed on the surface of the first upper electrode.

20 Claims, 28 Drawing Sheets

A

B

C

A

B

C

A

Forming condition (1) TiN film (lower electrode): 10 nm (2) TiO film (first dielectric film): 1 nm (250°C)

(3) ZrO film (second dielectric film): 5 nm (250°C)

(4) O₂ annealing (380°C, 10min)
   + N₂ annealing (450°C, 10min)

(5) ZrO film (third dielectric film): 1 nm (250 °C)

(6) TiN film (first upper electrode): 1 nm (250°C)

(7) Polycrystalline TiN film (second upper electrode): 10 nm (450°C)

B

METHOD FOR MANUFACTURING SEMICONDUCTOR MEMORY DEVICE

This application is based upon and claims the benefit of priority from Japanese Patent Application No. 2010-249791, filed on Nov. 8, 2010, the disclosure of which is incorporated herein in its entirety by reference.

TECHNICAL FIELD

The present invention relates to a method for manufacturing a semiconductor memory device. Particularly, the present invention relates to a DRAM (Dynamic Random Access Memory) comprising a capacitor with high dielectric constant and low leak current.

BACKGROUND ART

For a computer and other electronic devices, a DRAM (Dynamic Random Access Memory) is used as a semiconductor memory device capable of performing high-speed operation. A DRAM mainly comprises a memory cell array and a peripheral circuit region for operating the same. A memory cell array comprises a plurality of unit components arranged in a matrix type, and the one unit component comprises one switching transistor and one capacitor.

Like the other semiconductor devices, in order for a DRAM to meet needs for high integration, each cell has been miniaturized, and thus, a flat area needed to form a capacitor has been reduced. Therefore, in order to secure a capacity required for a memory device, the following study has been developed:

Electrodes are formed so as to have a three-dimensional structure.

Upper and lower electrodes are made of metal materials (MIM structure).

Capacitors are made so as to have a high dielectric constant.

As a result, in a region where minimum processing size (F value) used as a standard indicator of technology level is of 70 nm or less, electrodes of DRAM are essentially required to have a three-dimensional electrode structure. Upper and lower electrodes made of metals have been already commercialized. Therefore, the properties of a capacitor will most likely not be further improved based on such technology. In order to respond to further miniaturization for future, a major investigation to improve the properties of a capacitor is to make a capacitor insulating film having a high dielectric constant as a last solution.

A capacitor of a semiconductor memory device is required to have the properties:

(1) The capacitor has a large capacity, namely, a high dielectric constant (lower EOT, which will be described later); and (2) The capacitor has a capacitor insulating film with a low leak current.

However, in general, a high dielectric film with a large dielectric constant has low resistance for dielectric breakdown and high leak current. In other words, there is trade off relation between a high dielectric constant and a low leak voltage. In order to realize a more miniaturized memory cell, it is necessary to develop a highly reliable capacitor structure which does not increase a leak current even the capacitor has a high dielectric film, and a method for manufacturing the capacitor.

WO 2009/090979 discloses a method for preventing leak current by using an STO (strontium titanium oxide) film as a high dielectric film and TiN (titanium nitride) as upper and lower electrodes. Specifically, there is disclosed a flat capacitor, in which a buffer electrode made of an amorphous conductor such as TiSiN (titanium silicon nitride) is interposed between a lower electrode and a dielectric, and a dielectric and an upper electrode. WO 2009/090979 discloses that a lower electrode is covered by a buffer electrode of an amorphous conductor, thereby reducing concavity and convexity on the surface of the lower electrode and thus reducing a leak current.

After forming a capacitor, a heat treatment is needed to perform to DRAM at a temperature of 450° C. to 500° C. At this time, since a dielectric film of a single zirconium oxide film cannot have sufficient heat stability, a leak current increases after the heat treatment. Therefore, various attempts have been made in order to improve heat stability. For example, a ZAZ structure ($ZrO_2/Al_2O_3/ZrO_2$; Z means $ZrO_2$ layer, and A means $Al_2O_3$ layer) or a laminate in which $Al_2O_3$ layers and $ZrO_2$ layers are alternatively laminated, can be used as a multi-layered dielectric film.

Such structures can obtain the desired properties by combining zirconium oxide ($ZrO_2$) having a high dielectric constant and aluminium oxide ($Al_2O_3$) having a low dielectric constant but excellent heat stability.

For example, JP2006-135339 discloses a method for forming a multi-layered dielectric film such as an AZ structure, a ZA structure, a ZAZ structure, or a laminate in which $ZrO_2$ thin films and $Al_2O_3$ thin films are alternatively laminated used for a DRAM having F of 70 nm or less.

SUMMARY OF THE INVENTION

In one embodiment, there is provided a method for manufacturing a semiconductor memory device including a capacitor, comprising:

forming a lower electrode made of a titanium nitride film above a semiconductor substrate;

forming a dielectric film on the lower electrode; and forming an upper electrode including a titanium nitride film on the dielectric film, wherein at least the dielectric film contacting with the upper electrode is formed by atomic layer deposition (ALD) at a first temperature, a first titanium nitride film is formed in contact with the dielectric film at a second temperature that is greater than the first temperature by not more than 70° C., in forming the upper electrode, the first titanium nitride film is converted into a first upper electrode including a first polycrystalline titanium nitride film by a heat treatment, and a second upper electrode including a polycrystalline titanium nitride film is formed on a surface of the first upper electrode.

BRIEF DESCRIPTION OF THE DRAWINGS

The above features and advantages of the present invention will be more apparent from the following description of certain preferred embodiments taken in conjunction with the accompanying drawings, in which.

Figure 1:
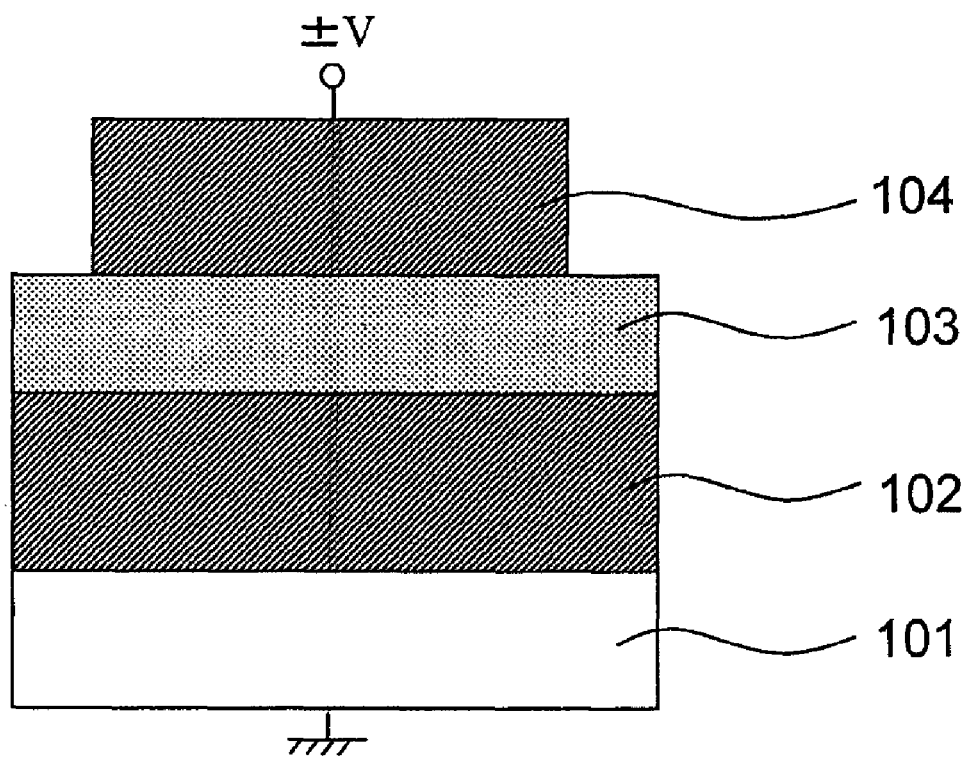
FIG. 1 is a schematic view of a conventional capacitor structure.

In the drawings, reference numerals have the following meanings: 101; silicon single-crystalline semiconductor substrate, 102; lower electrode, 103; dielectric film, 104; upper electrode, 105a, 105b, 105c; crystal grain, 105d; grain boundary, 107; lower electrode, 109; upper electrode, 110a; microcrystallite ZrO film, 110b; polycrystalline ZrO film, 111; crack, 112; upper electrode, 115a; TiO film, 115, 115b, 115c; ZrO film, 116a; first upper electrode, 116b; second upper electrode, 201; p-type silicon substrate, 202; n-well, 203, 204; p-well, 205; isolation region, 206, 207; switching transistor, 208, 212; drain, 209; source, 210; gate insulating film, 211; gate electrode, 213, 219, 222a, 222b, 226; interlayer insulating film, 214; polysilicon, 215; metal silicide, 216; bit line, 217; tungsten, 218, 230; wiring layer, 220; silicon plug, 221; conductor plug, 221a; barrier metal, 221b; metal, 222c; support film, 223; lower electrode, 223a; TiN film, 224; dielectric film, 225; support film, 225a; first upper electrode, 225b; second upper electrode, 225c; third upper electrode, 225d; fourth upper electrode, 227; metal via plug, 228; lead wiring, 229; metal plug, 231; opening, 232, 232a; cylinder hole, 234; protection film, 301, 302; capacitor, I; memory cell region, II; peripheral circuit region

DESCRIPTION OF PREFERRED ILLUSTRATIVE EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Zirconium oxide film ($ZrO_2$: hereinafter referred to as "ZrO") is preferable to be used as a dielectric film of a capacitor, because it can be easily applicable to a three-dimensional structure, can be easily formed as a film, and has a high dielectric constant. However, as mentioned in the "Related Art," a single-layered ZrO film has a problem with respect to control of a leak current.

The investigation results of leak current property in a single-layered ZrO film, which was performed by the inventors of the present invention, will be now explained with reference to FIGS. 1 to 5.

(First Test)

FIG. 1 shows a flat capacitor comprising a lower electrode 102 made of a titanium nitride (TiN) film, an upper electrode 104 made of a TiN film, and a dielectric film 103 made of a ZrO film sandwiched between the upper and lower electrodes, on a silicon single-crystalline semiconductor substrate 101.

The lower electrode 102 made of a TiN film was formed by CVD (Chemical Vapor Deposition) using titanium tetrachloride ($TiCl_4$) and ammonia ($NH_3$) as reaction gas, in consideration of application to a three-dimensional structure. The deposition temperature of the lower electrode 102 was 450° C. and the thickness of the lower electrode 102 was 10 nm. Hereinafter, a TiN film formed by CVD is referred to as a "CVD-TiN film."

Also, the ZrO film 103 was formed by ALD (Atomic Layer Deposition) using organic metal complex TEMAZ (tetrakis (ethylmethylamino) zirconium: $Zr[N(CH_3)CH_2CH_3]_4$) as Zr material gas and ozone ($O_3$) as reaction gas. The ZrO film 103 was formed at 250° C. and had a thickness of 6 nm. By ALD, the ZrO film was formed by repeating a series of steps (1) to (4) below until the desired thickness is obtained:

(1) supplying Zr material gas into a reaction chamber, in which a semiconductor substrate is provided, to adsorb an atomic layer on the surface of a lower electrode;

(2) pursing vapor remaining material gas by nitrogen gas;

(3) supplying ozone gas to oxidize the Zr material adsorbed onto the surface of the lower electrode; and (4) pursing vapor remaining ozone gas by nitrogen gas.

The upper electrode 104 made of a TiN film was formed by mask sputtering having a known area. In the mask sputtering, a flat mask is provided on the upper surface of a ZrO film and then a TiN film was deposited thereon by sputtering (hereinafter, referred to as "PVD"), thereby forming a dot-shaped upper electrode. The deposition of TiN film was performed at a room temperature and the thickness of TiN film was 10 nm.

Figure 2:
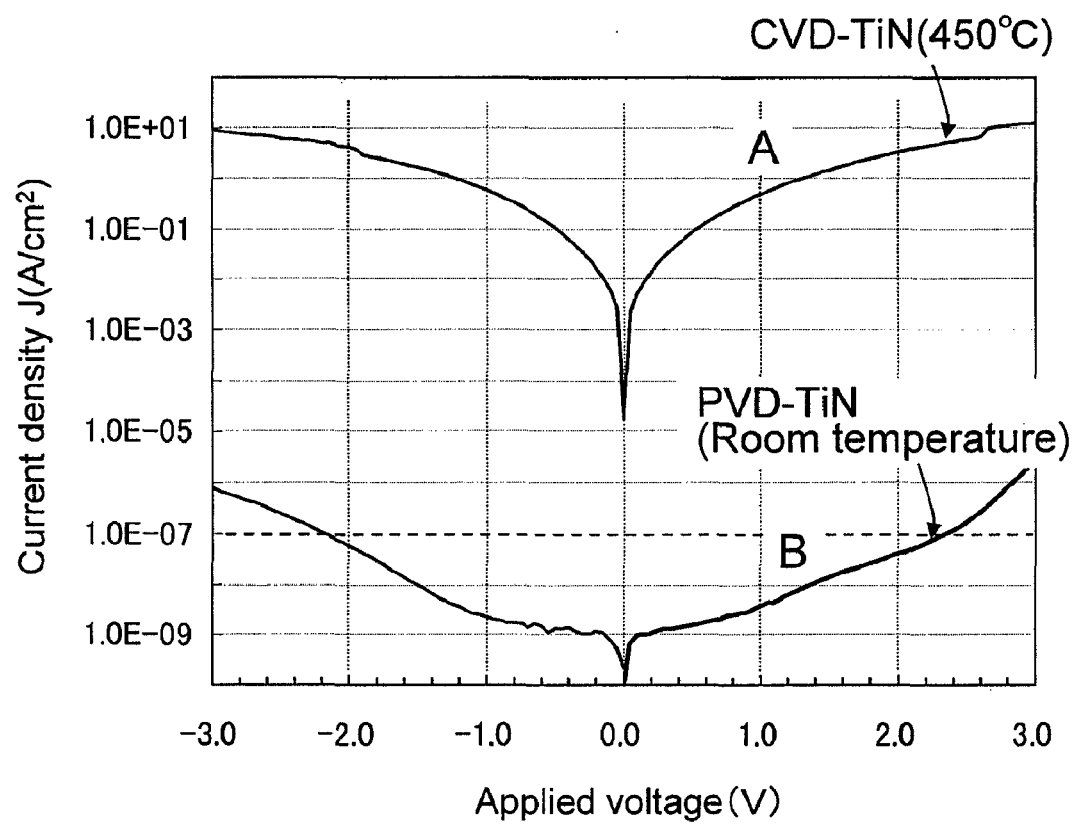
FIG. 2 is a graph showing the leak current property of a conventional capacitor.

Reference numeral B in FIG. 2 shows a leak current property when a current is applied to the upper electrode 104 in the above capacitor between −3V and +3V. It is found from FIG. 2 that the applied voltages are +2.3V and −2.2V at the current density of 1E-7 ($A/cm^2$) level (broken line in FIG. 2) as an indicator. Considering that the leak current standard available as a semiconductor memory device is +1V or more and −1V or less at the above current density level, the above capacitor has a leak current property with a sufficient margin.

Reference numeral A in FIG. 2 shows a leak current property when a TiN film formed by CVD (hereinafter, referred to as a "CVD-TiN film"), which is the same process as process used to form a lower electrode, was used as an upper electrode, instead of a TiN film (hereinafter, referred to as a "PVD-TiN film") formed by PVD. It is obvious from FIG. 2 that the leak current when using a CVD-TiN film as an upper electrode is seven times greater than the leak current when using a PVD-Tin film as an upper electrode. Therefore, a CVD-TiN film cannot be used as an upper electrode, because it is difficult to secure the information in a capacitor.

As mentioned above, in order to be used for a capacitor having a three dimensional capacitor, like a lower electrode, an upper electrode is required to be formed by CVD that has excellent step coverage. However, the leak current indicated by reference numeral A is remarkably high, and thus, a device including the capacitor of reference numeral A cannot function as a semiconductor memory device.

The inventors of the present invention diversely has investigated what differences between different processes for forming an upper electrode, namely, conditions of PVD and CVD, sharply change the leak current of a ZrO film as a dielectric film. As a result, the inventors supposed that the main factor to sharply change the leak current is a film-forming temperature. In other words, they supposed that the main factor is that an upper electrode was formed at a room temperature by PVD and at 450° C. by CVD.

Figure 3:
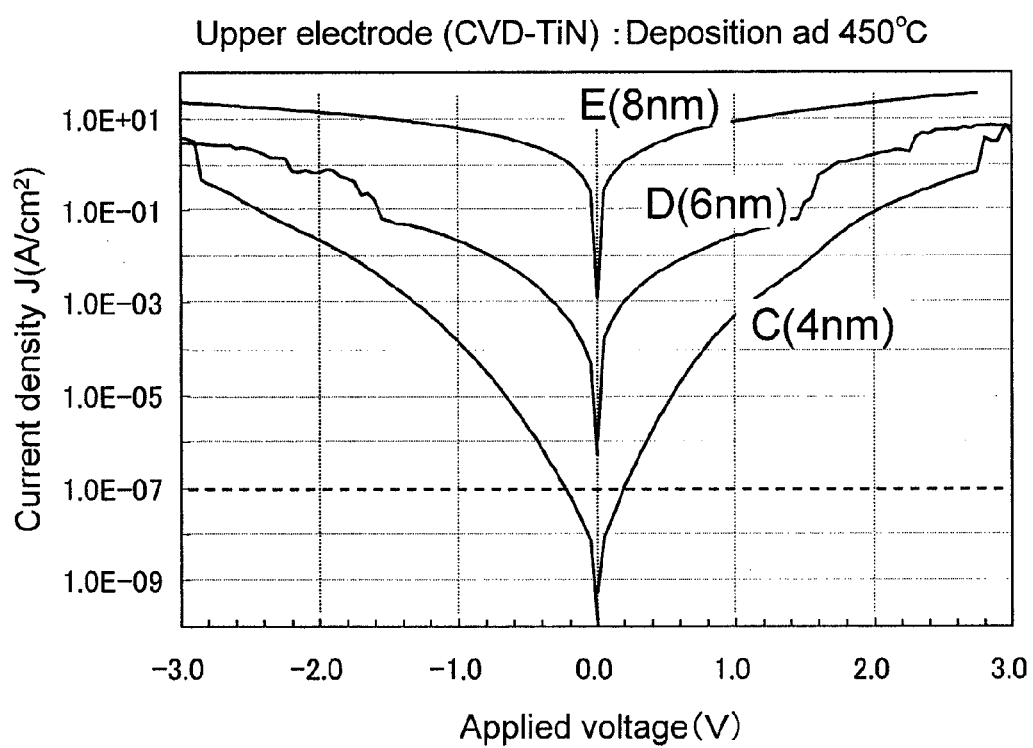
FIG. 3 is a graph showing the variation of the leak current property of a conventional capacitor depending on the thickness of a dielectric film.

Also, FIG. 3 also shows one example of the results of the investigation. FIG. 3 shows the leak current property when the thickness of a ZrO film in the capacitor in FIG. 1 is changed to 4 nm (reference numeral C), 6 nm (reference numeral D), and 8 nm (reference numeral E), and a CVD-TiN film formed at a deposition temperature of 450° C. is used as an upper electrode. Generally, as the thickness of an amorphous dielectric film, such as a silicon oxide film, silicon nitride film, or aluminium oxide film increases, the electric field strength in the film reduce, resulting in reducing the leak current. However, the ZrO film in FIG. 3 does not have such properties. The ZrO film in FIG. 3 has the lowest leak current when it has the thinnest thickness of 4 nm (reference numeral C). As the ZrO film in FIG. 3 has thicker thicknesses of 6 nm (reference numeral D) and 8 nm (reference numeral E), the thicker the film thickness is, the greater the leak current becomes.

FIG. 3 is considered to clearly suggest that a leak current relates to the crystallization mechanism of a ZrO film. Therefore, the inventors of the present invention investigated transmission electron microscope (TEM) images and measured X-ray diffraction peak strength, and thus, discovered the following fact.

Shortly after forming a ZrO film at 250° C., the ZrO film is in a polycrystalline state including microcrystal. If the ZrO film is heat-treated at a temperature higher than a temperature when forming the film, a secondary crystal grain growth occurs. The secondary crystal grain growth of the ZrO film varies depending on the thickness of the ZrO film. Therefore, when the ZrO film is converted into a polycrystalline structure under the same heat treatment condition, the thicker the film is, the larger the crystal grain size becomes. Herein, a crystal growth during forming a film is referred as "a primary crystal grain growth", while the following crystal grain growth is referred as a "secondary crystal grain growth".

The film is subjected to the heat treatment after forming a film, resulting in the relocation of constituent atoms of the film and the reformation of crystal grain boundary in the film. As a result, the crystal grain in the film becomes larger.

Figure 4:
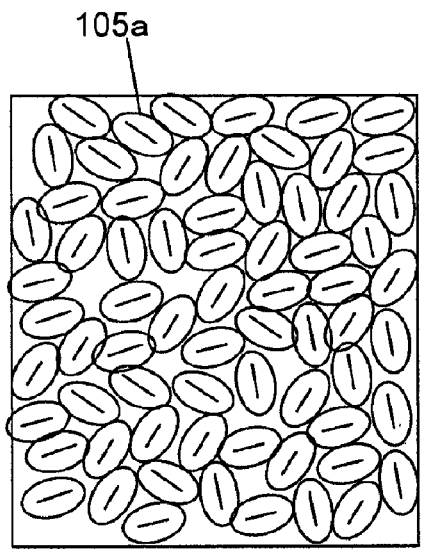
FIG. 4 schematically shows the crystalline state of a ZrO film, A has a thickness of 4 nm, B has a thickness of 6 nm, and C has a thickness of 8 nm.
Figure 4:
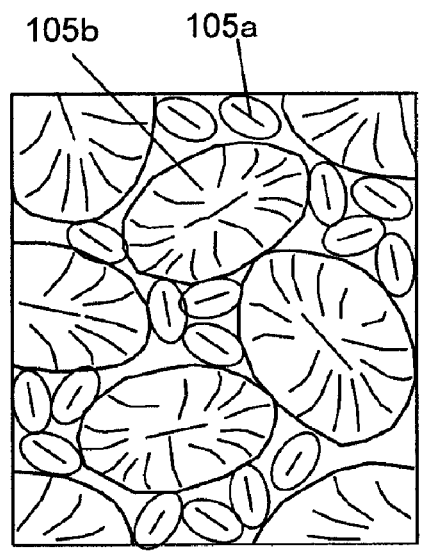
Figure 4:
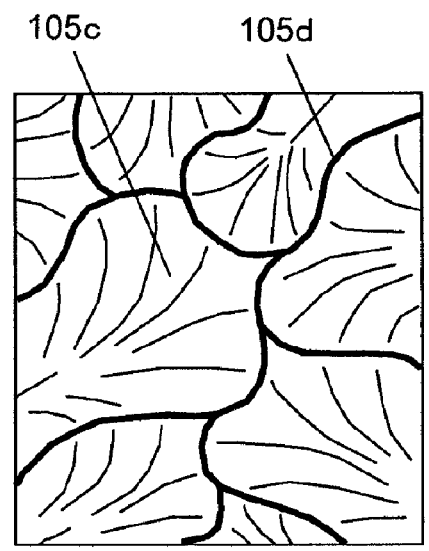

FIG. 4 schematically shows the crystalline state of the ZrO film by the above results. FIG. 4A has a thickness of 4 nm, FIG. 4B has a thickness of 6 nm, and FIG. 4C has a thickness of 8 nm, and FIGS. 4A to C show an image of a heat-treated CVD-TiN film at 450° C. which is a film deposition temperature. Although a grain growth is found in A having a thickness of 4 nm, the ZrO film is in a polycrystalline state including an assembly of small crystal grains 105a. In B having a thickness of 6 nm, crystal grains 105b larger than A are generated. The ZrO film of B is in a polycrystalline state, in which both small crystal grains 105a and large crystal grains 105b are mixed. In C having a thickness of 8 nm, small crystal grains are extinguished. The ZrO film of C becomes an assembly of crystal grains 105c larger than crystal grains 105b and is in a polycrystalline state, in which clear grain boundaries (105d; bold line) are generated. In the polycrystalline state of C, it appears that the volume shrink due to the relocation of constituent atoms of the ZrO film and the volatilization of impurity in the ZrO film by crystallization, resulting in generating cracks in the grain boundaries.

Figure 5:
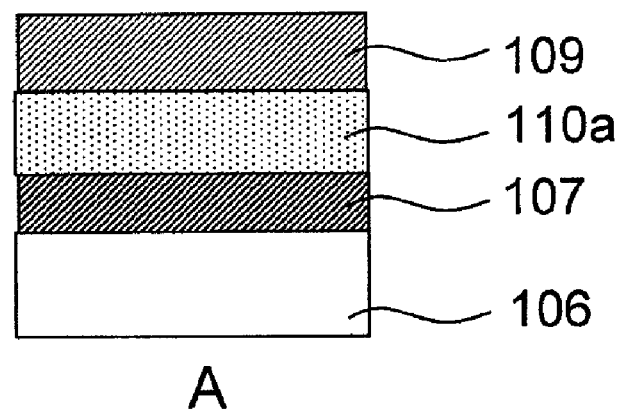
FIG. 5 is a schematic view for explaining the reason why cracks generated when forming an upper electrode increase a leak current, A is a case where an upper electrode is formed by room temperature PVD-TiN, B is a case where an upper electrode is formed by room temperature PVD-TiN after heat-treating of a dielectric film, and C is a case where an upper electrode is formed by CVD-TiN.
Figure 5:
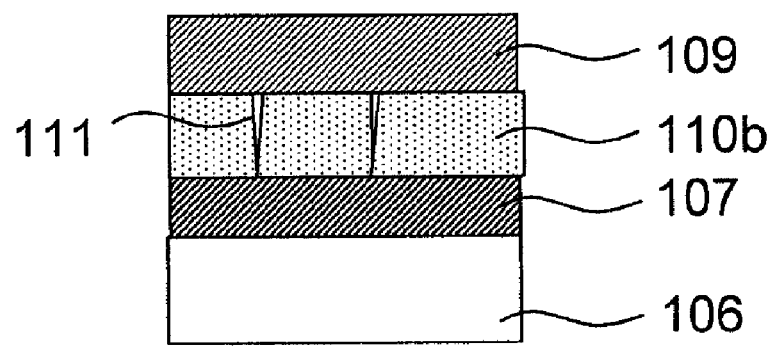
Figure 5:
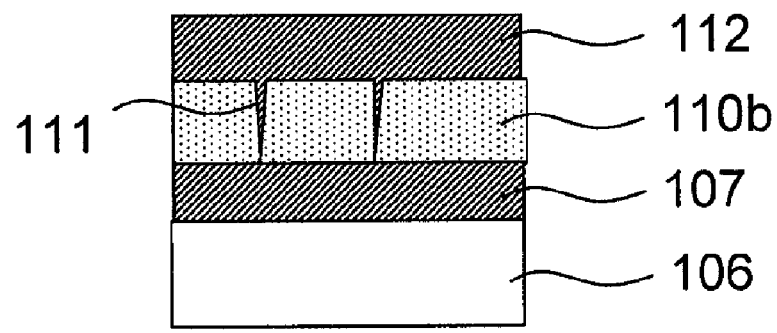

FIG. 5 is a mimetic view explaining why cracks generated when forming the above upper electrode increase a leak current.

FIG. 5A shows a capacitor in which a PVD-TiN film 109 was formed as an upper electrode 109 at a room temperature after forming a dielectric film 110a made of a ZrO film on a lower electrode 107 made of a TiN film by ALD (Atomic Layer Deposition). Since in case of FIG. 5A, the microcrystalline ZrO film 110a was not heat-treated at a temperature equal to or higher than a temperature when forming the film, no secondary crystal grain growth occurred and no crack was generated. As a result, a leak current has the properties indicated by reference numeral B in FIG. 2.

FIG. 5B shows a capacitor in which a PVD-TiN film was formed as an upper electrode 109 at a room temperature, after a microcrystalline ZrO film 110a was intentionally heat-treated at approximately 450° C. so as to promote a secondary crystal grain growth and was converted into a dielectric film made of a polycrystalline ZrO film 110b with cracks 111, in capacitor in FIG. 5A. As a PVD-TiN film has bad step coverage, a film could not be formed inside the cracks 111. Therefore, in case of FIG. 5B, a leak current has the same properties as indicated by reference numeral B in FIG. 2.

FIG. 5C shows a capacitor in which a CVD-TiN film was formed as an upper electrode 112 at 450° C. on the dielectric film, after forming a dielectric film 110a made of a ZrO film by ALD on a lower electrode 107 made of a TiN film. In case of FIG. 5C, the microcrystalline ZrO film 110a was converted into a polycrystalline ZrO film 110b and cracks 111 were generated due to a secondary crystal grain growth. Since a CVD-TiN film has excellent step coverage applicable to forming a three-dimensional electrode, it could be formed inside the cracks 111. Therefore, a leak current property in this case becomes depleted like reference numeral A in FIG. 2.

As shown in FIGS. 5A to 5C, although a semiconductor substrate was positioned in a film forming apparatus, preliminary heat-treatment was performed to the semiconductor substrate during a given time before forming a film until it reached a predetermined temperature stably, because it did not immediately reach a predetermined temperature. Therefore, during such preliminary heat-treatment, a microcrystalline ZrO film was heat-treated and a secondary crystal grain growth occurred, thereby generating cracks. After cracks were generated, a CVD-TiN film was continuously formed, and thus, the cracks were filled by the CVD-TiN film.

As a result, in the bottom of the crack 111, the CVD-TiN film 112 as an upper electrode was opposite to the lower electrode 107 so as to interpose a very thin dielectric film 110b between the upper electrode and lower electrode, a leak current increased. In extreme case, short circuit current may occur between the upper and lower electrodes. Also, even if a secondary crystal grain growth is delayed due to a thin ZrO film, cracks are locally generated. Therefore, a leak current increases. Furthermore, even if cracks are clearly not generated, concavity and convexity increases on the surface due to a surface atom transfer caused by a secondary crystal grain growth, and thus, a relatively thin portion of the film is generated, resulting in increasing a leak current. It is supposed that such crack generation causes sharp degradation that changes the leak current by 7-digit number, as indicated in FIG. 2.

As mentioned above, it is supposed that during preliminary heat-treatment at 450° C. shortly before forming a CVD-TiN film, a ZrO film is in a polycrystalline state including large crystal grains, and thus, cracks are generated in the grain boundaries and a CVD-TiN film having excellent step coverage is formed inside the cracks. Therefore, as shown in FIG. 2, if a PVD-TiN film is used as an upper electrode, a leak current reduces and if a CVD-TiN film formed by heat treatment is used as an upper electrode, a leak current increases. If a PVD-TiN film is used as an upper electrode, it is possible to avoid the adverse effect due to cracks. However, as a PVD-TiN film has bad step coverage, it is not applicable to a three-dimensional structure.

(First Exemplary Embodiment)

Based on the above results, the inventors of the present invention found that the surface of the ZrO film is covered with a protection film at a temperature that a secondary crystal grain growth of the ZrO film does not occur, and thereafter, found a CVD-TiN film is formed as an upper electrode in order to avoid cracks generated by a secondary crystal grain growth of a ZrO film. Also, they found that a titanium nitride (TiN) film is preferable as the protection film. In other words, a TiN film is formed on the surface of a ZrO film, as a first upper electrode which is a protection film, at a temperature that a secondary crystal grain growth of the ZrO film does not occur. Thereafter, a TiN film is formed on the surface of the first upper electrode as a second upper electrode, at a temperature that a secondary crystal grain growth of the ZrO film occurs.

A capacitor, in which a TiN film as a first upper electrode is adjacent onto the surface of a ZrO film that is a dielectric film, will be explained below.

Figure 6:
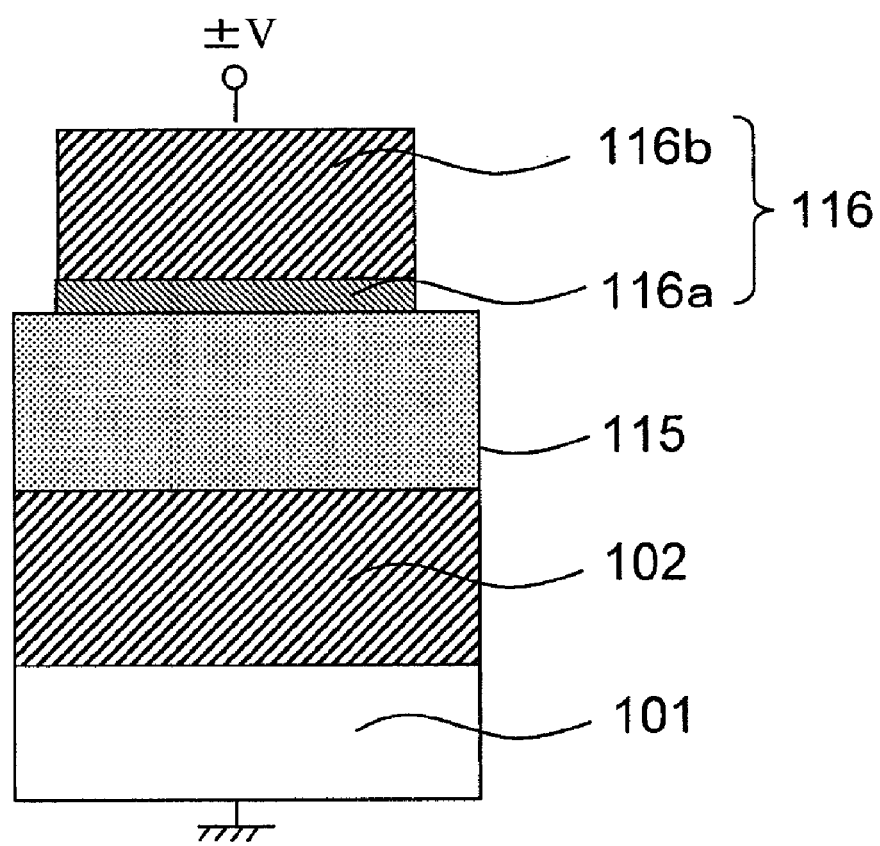
FIG. 6 is a schematic cross-sectional view of a capacitor included in a semiconductor memory device according to the first exemplary embodiment.

FIG. 6 shows a capacitor comprising a lower electrode 102 made of a TiN film, a dielectric film 115 made of a polycrystalline ZrO film having a thickness of 6 nm, a first upper electrode 116a made of a TiN film having a thickness of 1 nm, and a second upper electrode 116b made of a TiN film in order on a silicon single crystalline semiconductor substrate 101. Also, the capacitor according to this embodiment is different from that included in a three-dimensional semiconductor memory device that will be described below, and is a flat capacitor for easier manufacture and property evaluation.

A method for manufacturing the capacitor in FIG. 6 will be explained below.

On a semiconductor substrate 110, a TiN film as a lower electrode 102, was formed by CVD using $TiCl_4$ and $NH_3$ reaction gas, so that it is applicable to a three-dimensional structure, as described in the above first test. The TiN film may be formed at 380 to 600° C., was formed at 450° C. in this embodiment, and the thickness thereof was 10 nm. The TiN film was formed in a polycrystalline state at the time of the film deposition.

Next, a ZrO film as a dielectric film 115 was formed so as to have a thickness of 6 nm by ALD using TEMAZ and ozone at 250° C., as described in the above first test. The ZrO film was in a microcrystalline state when it was formed by ALD. The Zr material is gas not limited to TEMAZ. The reaction gas is not limited to ozone. $H_2O$ may be used as the reaction gas. Further, the ZrO film is preferably formed at 210 to 280° C. If the ZrO film is formed at a temperature lower than 210° C., reaction may not occur, and if the ZrO film is formed at a temperature higher than 280° C., the Zr material gas may be decomposed in a gas phase, and thus, it may be difficult to form it by ALD. Also, since the ZrO film forming temperature from 210 to 280° C. is similar to the temperature (250° C.) at which the ZrO film as the dielectric film 115 is formed, a secondary crystal grain growth of the ZrO film did not occur and the ZrO film remained a microcrystalline state.

Next, a TiN film as a first upper electrode 116a was formed. The TiN film was formed in a microcrystalline state or in an amorphous state during forming it. The TiN film was formed by ALD using titanium tetrachloride ($TiCl_4$) as Ti material gas and ammonia ($NH_3$) as reaction gas at 250° C. so as to have a thickness of 1 nm. Ammonia gas was provided in a plasmarized state.

Forming the TiN film by ALD comprises the following steps:

(1) supplying Ti material gas into a reaction chamber, in which a semiconductor substrate is positioned, to adsorb the Ti material gas having an atomic layer level thickness on the surface of a dielectric film 115;

(2) pursing vapor remaining Ti material gas by nitrogen gas;

(3) supplying plasmarized ammonia to nitride the Ti material gas adsorbed onto the dielectric film 115; and (4) pursing vapor remaining ammonia by nitrogen gas.

A basic sequence of the above four steps was repetitively performed until the film has a thickness of 1 nm. Since the film formation by ALD uses surface adsorption reaction, ALD has excellent step coverage and is applicable to a three-dimensional structure. As nitrogen radical having a high energy level is generated due to plasmarized ammonia, the reactivity is improved, and thus, nitriding reaction can be promoted at a low temperature of 250° C.

Also, the Ti material gas is not limited to $TiCl_4$. TDMAT (tetrakis(dimethylamino)titanium: $Ti[N(CH_3)_2]_4$) or TDEAT (tetrakis(diethylamino)titanium: $Ti[N(C_2H_5)_2]_4$) may be used as the Ti material gas. The Ti material gas may be used alone or in combination.

Also, the reaction gas is not limited to ammonia. The gas such as $N_2$, $N_2+NH_3$, $N_2+H_2$, may be used as the reaction gas. If TDMAT or TDEAT is used as the Ti material gas, plasmarized reaction gas is provided.

Next, a TiN film was formed as a second upper electrode 116b. Like the lower electrode 102, the TiN film having a thickness of 10 nm as second upper electrode 116b was formed at 380 to 600° C., preferably at 450° C. by CVD so that it is applicable to a three-dimensional structure.

Also, a mask material (not shown) having a known area was formed on the second upper electrode 116b and the upper electrode was etched by using the mask material as a mask and was removed, to form the capacitor illustrated in FIG. 6.

In this embodiment, since the second upper electrode 116b was formed at 450° C., the already formed dielectric film 115 was converted from a microcrystalline ZrO film to a polycrystalline ZrO film. Also, the first upper electrode 116a was converted from a microcrystalline or amorphous TiN film to a polycrystalline TiN film. As a result, the capacitor in this embodiment comprises a lower electrode 102 made of a polycrystalline TiN film, a dielectric film 115 made of a polycrystalline ZrO film, a first upper electrode 116a made of a polycrystalline TiN film, and a second upper electrode 116b made of a polycrystalline TiN film. In other words, the capacitor comprises a lower electrode 102 connected to a conductive region in a semiconductor substrate 101, a dielectric film 115 contacting with the lower electrode 102 to cover it, and an upper electrode formed on the dielectric film 115 to contacting with it. The upper electrode comprises a first upper electrode 116a including a polycrystalline TiN film and contacting with the dielectric film and a second upper electrode 116b including a polycrystalline TiN film and deposited on the first upper electrode.

Figure 7:
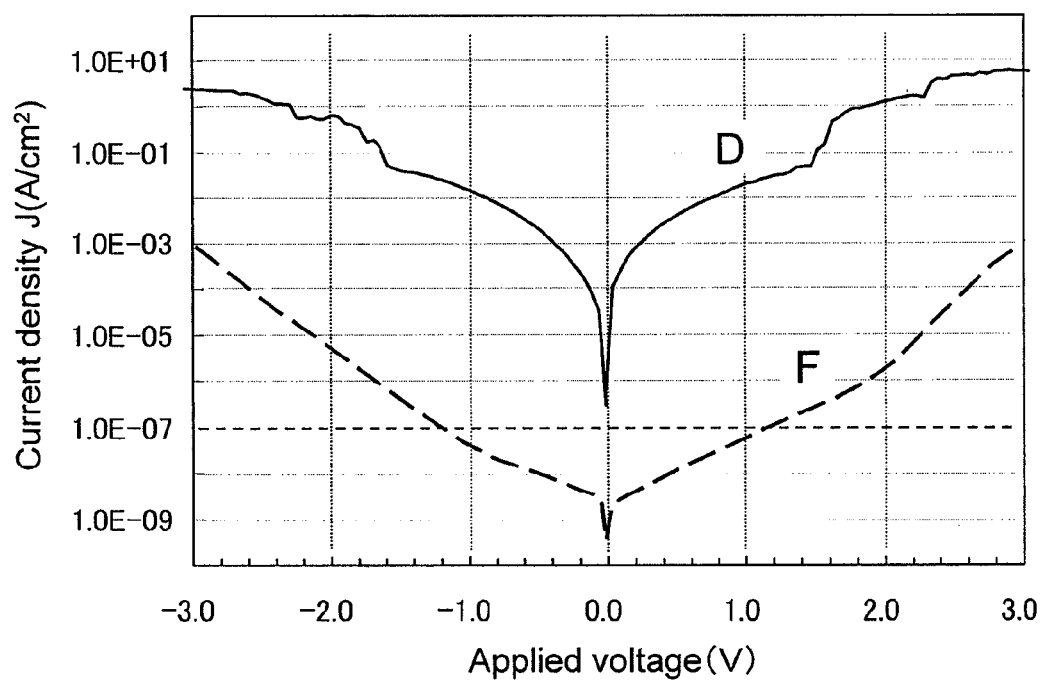
FIG. 7 is a graph showing the leak current property of the capacitor in FIG. 6 and the leak current property of a conventional capacitor.

FIG. 7 shows the leak current property of the capacitor in FIG. 6. In FIG. 7, the X-axis indicates a voltage applied to an upper electrode and the Y-axis indicates a leak current per unit area corresponding to the applied voltage. Reference numeral D shows a leak current in capacitor including the ZrO film which is indicated by reference numeral D in FIG. 3 and has a thickness of 6 nm. Reference numeral F shows a leak current of the capacitor in this embodiment which comprises a first upper electrode 116a made of a TiN film having a thickness of 1 nm. If reference numeral D is compared with reference numeral F at the applied voltage of +1V, in reference numeral D (the first upper electrode 116a is not provided), the leak current is 2E-2 (A/cm$^2$) while in reference numeral F (the first upper electrode 116a is provided), the leak current is 7E-8 (A/cm$^2$).

As clearly shown in FIG. 7, the capacitor (F) comprising a first upper electrode 116a made of a polycrystalline TiN film having a thickness of 1 nm has a lower leak current by 5-digit number than the capacitor (D) comprising no first upper electrode 116a, and thus, the leak current is sharply improved. The capacitor having the leak current indicated by reference numeral F has an EOT of 0.70 nm. Also, the EOT is calculated from EOT=$\in$o*$\in$r*S/C based on capacity value C obtained from capacity-voltage property and the relative dielectric constant $\in$r (3.85) of silicon oxide, wherein $\in$o is a dielectric constant of vacuum and S is an area of the upper electrode.

The above results teach that during forming the second upper electrode 116b at 450° C., the first upper electrode 116a effectively functions as a protection film for avoiding the generation of cracks when the dielectric film 115 is crystallized. In order to further investigate such teaching, the inventors of the present invention examined how the leak current changed if the dielectric film made of a microcrystalline ZrO film was heat-treated before forming the first upper electrode 116a. In other words, like the method for manufacturing the capacitor in FIG. 6, the dielectric film 115 made of a microcrystalline ZrO film having a thickness of 6 nm was formed on the lower electrode 102 at 250° C. by ALD. Thereafter, the dielectric film 115 was heat-treated for 10 minutes at 450° C. in nitrogen atmosphere.

The dielectric film 115 was in a polycrystalline state when it was heat-treated. Thereafter, the first upper electrode 116a made of a TiN film having a thickness of 1 nm was formed on the heat-treated dielectric film 115 at 250° C. by ALD. Also, the second upper electrode 116b made of a polycrystalline TiN film having a thickness of 10 nm was formed at 450° C. by CVD. Therefore, a capacitor was formed by forming the electrode pattern according to the process of FIG. 6.

Figure 8:
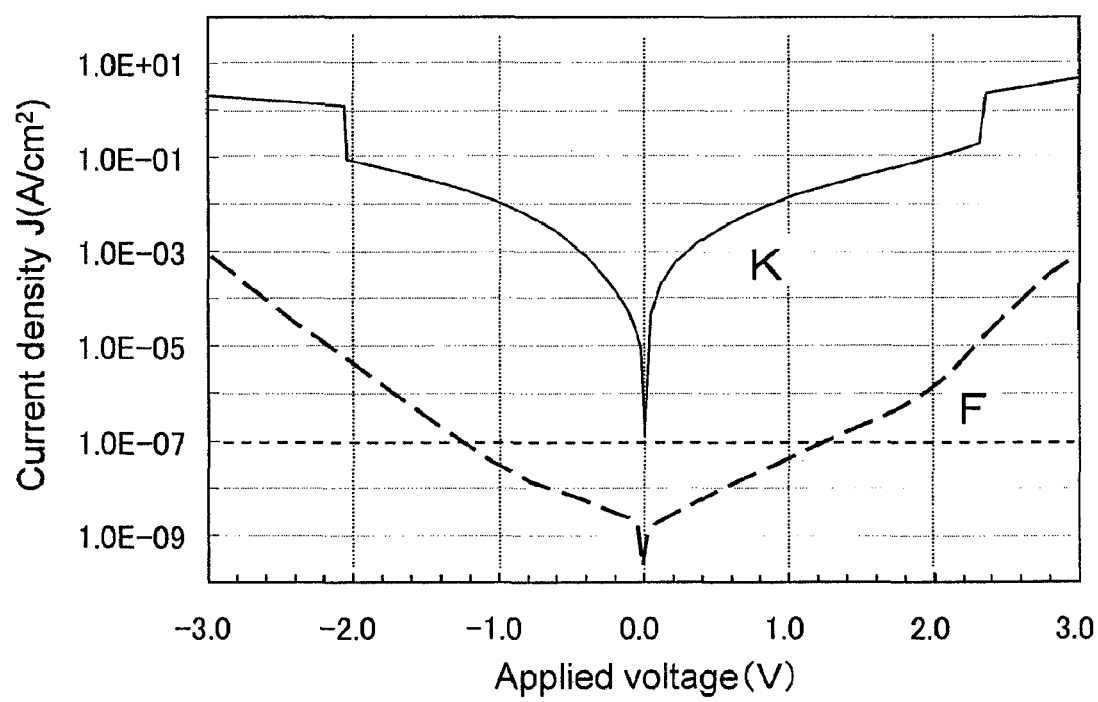
FIG. 8 is a graph showing the leak current property of the capacitor in FIG. 6 in order to explain the effect of a first upper electrode as a protection film.

The leak current property of this capacitor is indicated by reference numeral K in FIG. 8. Reference numeral F in FIG. 8 is the same as reference numeral F in FIG. 7. As clearly shown in FIG. 8, if the dielectric film 115 is heat-treated before forming the first upper electrode 116a, the leak current increases. When +1V voltage is applied, the leak current is a 2E-2 (A/cm$^2$), and it is found that the leak current can not be maintained within 1 E-7 (A/cm$^2$) or lower level available for a semiconductor memory device.

Also, only the results of 450° C. heat treatment are shown in FIG. 8. It was also found that even if the dielectric film 115 was heat-treated at 350° C., a leak current increased. No leak current change was found by 300° C. heat treatment. In other words, it was found that when a dielectric film was formed at 300° C. which was higher by 50° C. than a temperature (250° C.) that a dielectric film was formed by ALD, there had no practical problem because secondary crystal grain growth occurred less. Further, it is understood that if a dielectric film is heat-treated at a temperature higher by 70° C. or less than an ALD film formation temperature, there is practically no problem. In this case, at least the dielectric film contacting with the upper electrode is formed by atomic layer deposition (ALD) at a first temperature. A first titanium nitride film is formed in contact with the dielectric film at a second temperature that is greater than the first temperature by not more than 70° C. As a result, the leak current property is improved. In other words, A-B is 70° C. or less, wherein A is temperature for forming the first titanium nitride film and B is temperature for forming the dielectric film by the ALD, resulting in obtaining a low leak current. The microcrystalline ZrO film 115 and the first upper electrode 116a made of a TiN film are formed by ALD at the same temperature range of 210° C. to 280° C., and thus, the temperature difference falls within 70° C. It is preferable not to perform unnecessary heat treatment between forming the microcrystalline ZrO film 115 and the first upper electrode 116a.

As mentioned above, it is obvious that if a ZrO film is heat-treated at a temperature higher by 70° C. or more than a temperature that the ZrO film is formed before forming the first upper electrode 116a made of a TiN film, the first upper electrode 116a made of a TiN film cannot function as a protection film. In other words, as shown in FIG. 5, if the first upper electrode as a protection film is formed after cracks are generated in the dielectric film 115 by heat treatment, it is not possible to avoid the increase of leak current. Therefore, it is not possible to obtain a practicable capacitor.

Accordingly, in order to avoid the increase of leak current, it is significant to form the first upper electrode 116a as a protection film, so as to cover the surface of the microcrystalline ZrO film at a temperature that a secondary crystal grain growth of the dielectric film 115 occurs less, preferably at a temperature that a secondary crystal grain growth hardly occurs. If the first upper electrode 116a is formed at a temperature equal to or lower than a temperature that the microcrystalline ZrO film 115 is formed, the secondary crystal grain growth does not occur.

It is conceivable that the increase of leak current is avoided by forming the first upper electrode 116a for the reasons as set forth below. At a temperature that a secondary crystal grain growth of the dielectric film 115 less occurs, preferably at a temperature a secondary crystal grain growth hardly occurs, the first upper electrode 116a is formed, thereby maintaining surface flatness of the dielectric film 115 during forming the first upper electrode 116a is formed. The first upper electrode 116a formed on the surface of the dielectric film 115 fixes the molecules or atoms comprised in the surface of the dielectric film 115. Therefore, even if heat treatment is performed at temperature that a secondary crystal grain growth of the microcrystalline ZrO film 115 generally occurs, to generate cracks, in this embodiment, molecules or atoms comprised in the surface of the ZrO film 115 cannot transfer, and thus, the shape of the surface does not change. Therefore, the flatness of the surface of the polycrystalline dielectric film 115 is maintained. Accordingly, if the dielectric film 115 is subjected to the heat treatment which performs a secondary crystal grain growth of the microcrystalline ZrO film 115 after forming the first upper electrode 116a, a secondary crystal grain growth occurs inside the dielectric film 115 so as to relax the stress in the films. However, the flatness of the surface thereof is maintained, and thus, no crack is generated in the dielectric film 115. Since it is possible to avoid cracks in the dielectric film 115, thereby preventing an upper electrode being formed inside cracks, and thus, preventing a leak current from increasing.

As mentioned above, in this embodiment, after forming a dielectric film by ALD, without performing unnecessary heat treatment of the deposited dielectric film, it is necessary to form a first upper electrode as a protection film, by ALD and to coat the surface of the dielectric film with the first upper electrode.

Next, a leak current property will be explained with reference to FIG. 9, when the thickness of a ZrO film as the dielectric film 115 changes in the structure of FIG. 6.

Reference numeral H, F, I, J, and K shows a leak current property when the ZrO film has a thickness is 7 nm, 6 nm, 5.5 nm, 5 nm, and 4.5 nm, respectively. Also, reference numeral C in FIG. 9 is the same as reference numeral C in FIG. 3 and shows a leak current property when the ZrO film has a thickness of 4 nm and the first upper electrode 116a (a TiN film as a protection film) is not provided.

Figure 9:
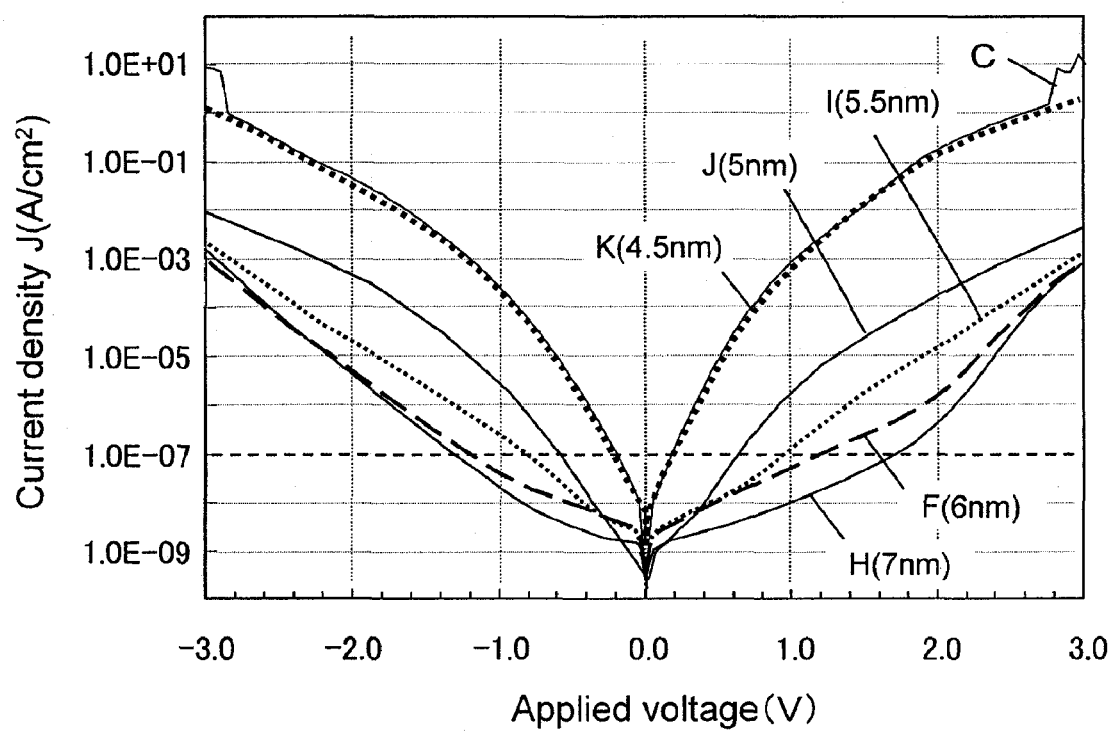
FIG. 9 is a graph showing the variation of the leak current property of the capacitor in FIG. 6 depending on the thickness of a dielectric film.

As clearly shown in FIG. 9, reference numeral K for the ZrO film having a thickness is 4.5 nm has the same leak current property as the ZrO film having a thickness of 4 nm, in which a TiN film as a protection film is not provided. Therefore, if the ZrO film has a thickness of 4.5 or less, the first upper electrode 116a cannot function as a protection film. If the ZrO film has a thickness of 5 nm or more, as the thickness of the ZrO film increases, a leak current uniformly reduces and the first upper electrode 116a made of a TiN film functions as a protection film. If the first upper electrode 116a made of a TiN film is not provided, cracks are generated in the ZrO film, and thus, as the thickness of the ZrO film increases, the leak current increases. The results are ones opposite to results of FIG. 3. As a result, a TiN film as the first upper electrode 116a functions as a protection film that is effective in avoiding cracks in the ZrO film.

The EOTs of each sample in FIG. 9 are 0.52 nm when the ZrO film has a thickness of 5 nm, 0.63 nm when the ZrO film has a thickness of 5.5 nm, 0.7 nm when the ZrO film has a thickness of 6 nm, and 0.83 nm when the ZrO film has a thickness of 7 nm. As the thickness of the ZrO film is 8 nm, the leak current reduces and but, the EOT is 0.95 nm. Therefore, it is not possible to obtain the desired EOT, 0.9 nm or less, of the present invention. Accordingly, the thickness of the ZrO film suitable for achieving the objective of the present invention is preferably 5 nm or more in consideration of the improvement of leak current and 7 nm or less in consideration of obtaining EOT. Also, in this embodiment, if the thickness is 5 nm or 5.5 nm, the leak current is over 1E-7 (A/cm$^2$) or less under 1V bias that is a practicable standard for a semiconductor memory device. However, it is possible to make the leak current of the capacitor having thickness of 5 nm or 5.5 nm to be 1E-7 (A/cm$^2$) or less, by using a TiO film as a dielectric film adjacent to a lower electrode and miniaturizing the dielectric films, as described in the following embodiments, Next, the effects of the thickness of a TiN film used as the first upper electrode 116a on leak current property will be explained with reference to FIG. 10.

Figure 10:
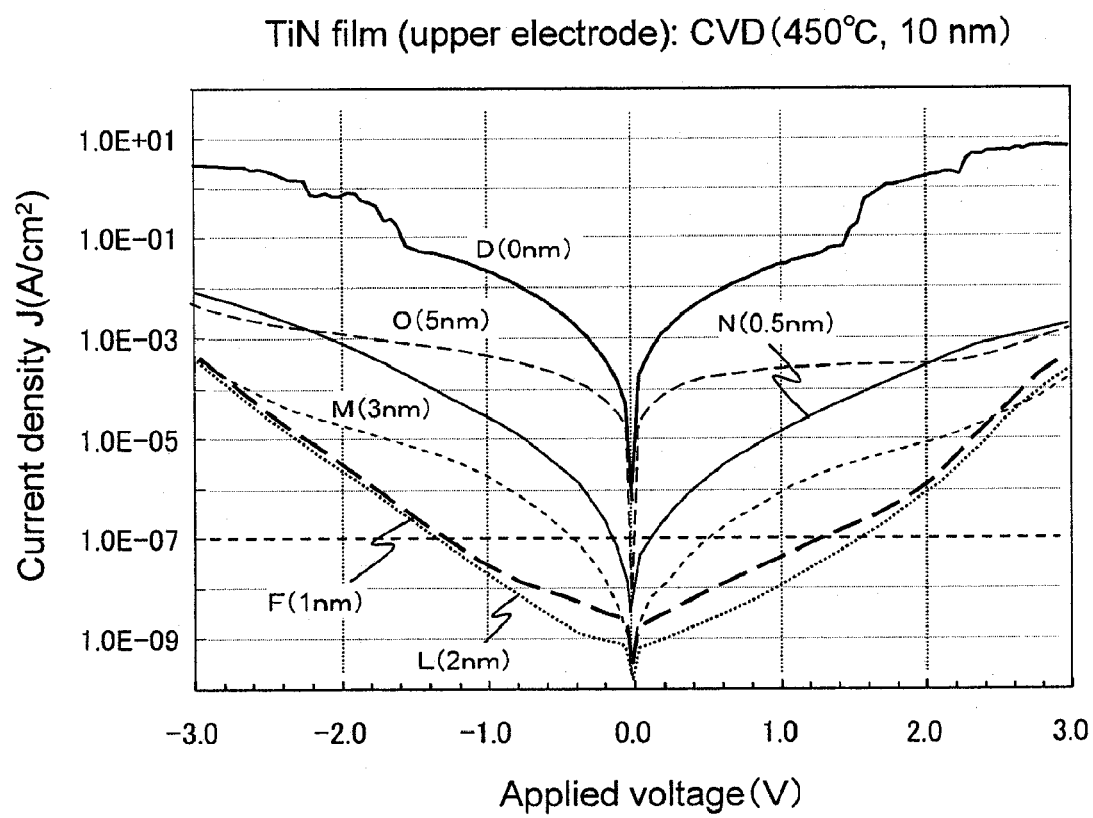
FIG. 10 is a graph showing the effect of the thickness of a first upper electrode on the leak current property of the capacitor in FIG. 6.

FIG. 10 shows leak current property when the thickness of a TiN film used as the first upper electrode 116a changes in the capacitor in FIG. 6. The constituents of capacitors of FIG. 10 are the same as those of FIG. 6, except for the change in a film thickness. Reference numeral D, O, N, M, F, and L shows a leak current property when the thickness of a TiN film 0 nm, 5 nm, 0.5 nm, 3 nm, 1 nm, and 2 nm, respectively.

Based on the results shown in FIG. 10, the following facts are obvious:

(1) Leak current is highest when no TiN film is formed (thickness 0 nm; reference numeral D).

(2) Leak current is very high when the TiN film has a thickness of 5 nm (reference numeral O).

(3) Significant improvement of leak current is found when the TiN film has a thickness of 3 nm (reference numeral M). However, it is not suitable for practical use.

(4) When the TiN film has a thickness of 1 to 2 nm, remarkable effects are obtained and capacitors having such effects can be used for practical purpose. Leak current is lowest when the thickness of the TiN film is 2 nm.

(5) When the TiN film becomes thinner to 0.5 nm, leak current increases by contraries and it cannot functions as a protection film.

Based on the above results, even if a very thick TiN film or a very thin TiN film is formed, a leak current cannot reduce. It is found that there is the most appropriate thickness range of a TiN film for reducing a leak current. Based on the above facts (1) to (5), in order to avoid cracks in a dielectric film and reduce a leak current, the preferable thickness of a TiN film is 1 to 2 nm. If the thickness is less than 1 nm, it is not possible to avoid cracks in a dielectric film. If the thickness is more than 2 nm, the stress of the TiN film begins to increase by heat treatment when forming an upper electrode and the TiN film may lose a function as a protection film. It is supposed that the reason why the TiN film does not function as the protection film is to distort the structure of a dielectric film distorts due to the stress of the TiN film.

(Second Exemplary Embodiment)

As mentioned in the first exemplary embodiment, in a capacitor comprising a ZrO film as a dielectric film, a TiN film as a second upper electrode is formed at 380 to 600° C. In this case, in order to avoid cracks due to a secondary crystal grain growth of the ZrO film, it is necessary to cover the surface of the microcrystalline ZrO film with a protection film made of a TiN film before forming the second upper electrode.

Figure 11:
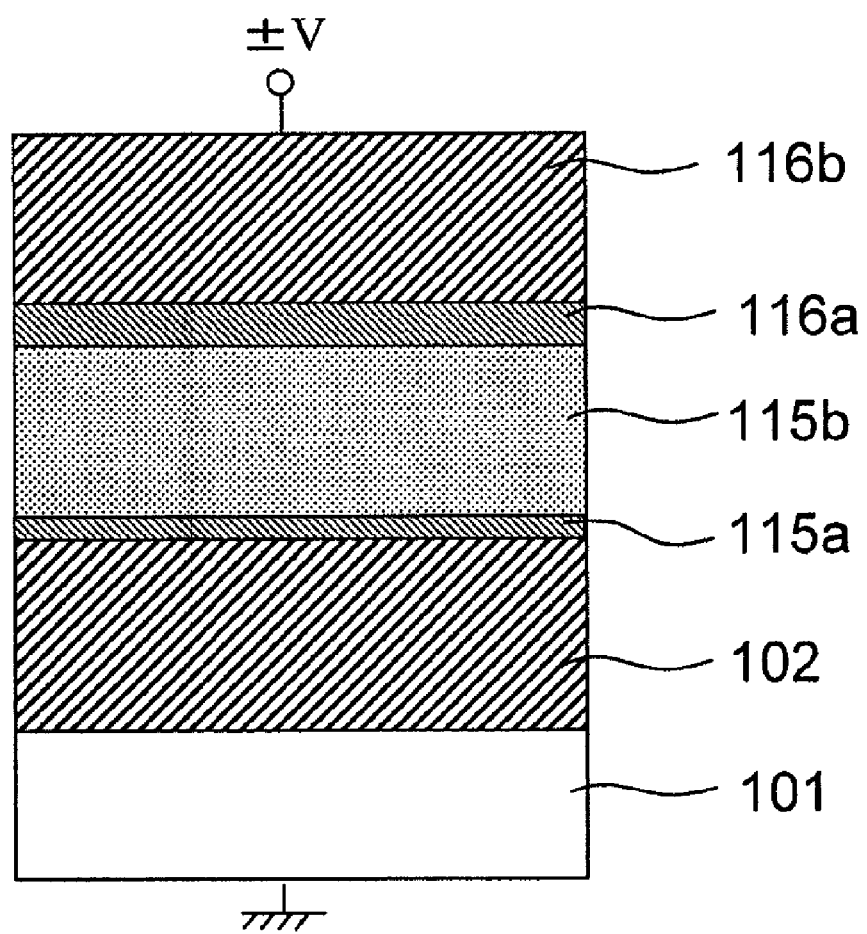
FIG. 11 is a schematic cross sectional view of a capacitor included in a semiconductor memory device according to the second exemplary embodiment.
Figure 12:
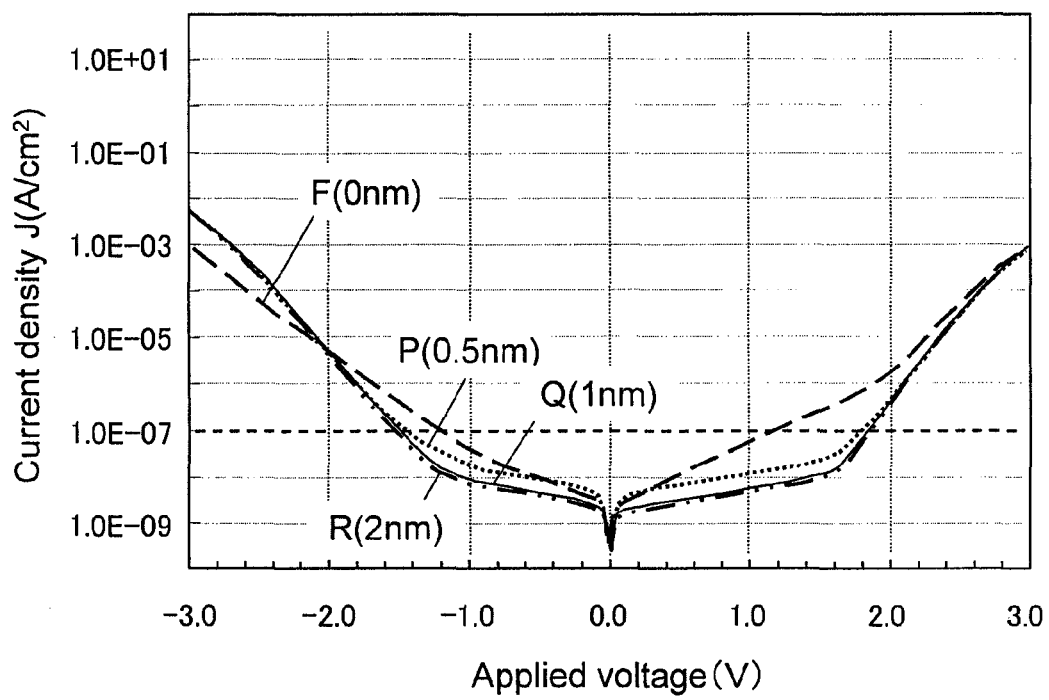
FIG. 12 is a graph showing the variation of the leak current property of the capacitors in FIGS. 6 and 11 depending on the thickness of a first dielectric film.
Figure 13:
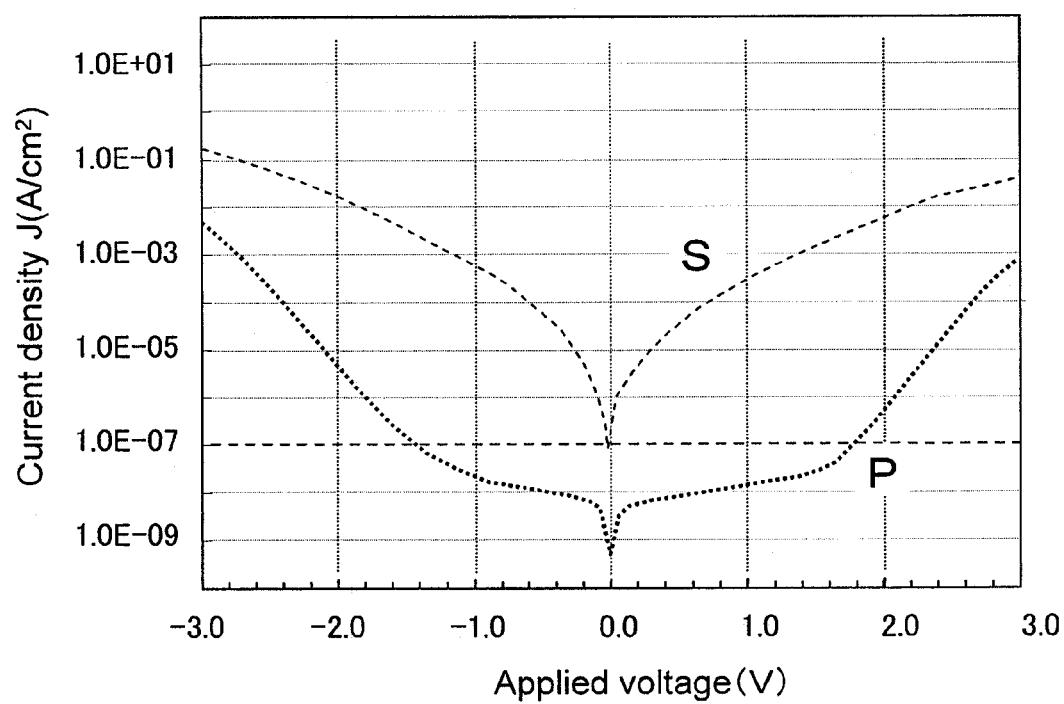
FIG. 13 is a graph showing the leak current property of the capacitor in FIG. 11 in order to explain the effect of a first upper electrode as a protection film.

In order to further improve leak current, this embodiment will explain a capacitor that further comprises a TiO film between a TiN film as a lower electrode and a ZrO film as a dielectric film, with reference to FIGS. 11 to 13. Also, the capacitor in this embodiment comprises a TiN film 116b as a second upper electrode; a TiN film 116a as a first upper electrode; a polycrystalline ZrO film 115b as a second dielectric film; a TiO film 115a as a first dielectric film; and a TiN film 102 as a lower electrode in this order. In this structure comprising a TiN film/a TiN film/a ZrO film/a TiO film/a TiN film, a combination of the TiN film as a first upper electrode, the ZrO film as a second dielectric film, and the TiO film as a first dielectric film, is referred to as a "TNT structure."

FIG. 11 shows the capacitor in this embodiment. FIG. 11 shows a capacitor comprising a lower electrode 102 made of a polycrystalline TiN film; a first dielectric film 115a made of a TiO film; a second dielectric film 115b made of a polycrystalline ZrO film; and an upper electrode including a first upper electrode 116a made of a polycrystalline TiN film and a second upper electrode 116b made of a polycrystalline TiN film, on a silicon single crystalline semiconductor substrate 101.

The capacitor in this embodiment is different from the capacitor in the first exemplary embodiment in that the dielectric film comprises a first dielectric film 115a made of a TiO film and a second dielectric film 115b made of a ZrO film. Also, in the capacitor in this embodiment, a TiO film as the first dielectric film 115a is in an amorphous state when it has a thickness of 0.8 nm or less, as described below and is in a polycrystalline state when it has a thickness of 1 nm or more. FIG. 11 does not show such difference in crystalline state.

A method for manufacturing the capacitor in FIG. 11 will be explained below. On a semiconductor substrate 110, a polycrystalline TiN film as a lower electrode 102 was formed by CVD using $TiCl_4$ and $NH_3$ reaction gas, so that it is applicable to a three-dimensional structure, as described in the first exemplary embodiment. The TiN film may be formed at 380 to 600° C., was formed at 450° C. in this embodiment, and the thickness thereof was 10 nm. The TiN film was formed in a polycrystalline state during forming the film.

Next, a TiO film as a first dielectric film 115a was formed. The TiO film was formed by ALD using TTIP (titanium tetraisopropoxide: Ti $(OCHMe_2)_4$) as Ti material gas and ozone gas as reaction gas at 250° C.

Forming the TiO film by ALD comprises the following steps:

(1) supplying Ti material gas into a reaction chamber, in which a semiconductor substrate is positioned, to adsorb the Ti material gas having the thickness of an atomic layer level on the surface of a lower electrode 102;

(2) pursing vapor remaining Ti material gas by nitrogen gas;

(3) supplying ozone to oxide the adsorbed Ti material gas; and (4) pursing vapor remaining ozone by nitrogen gas.

A basic sequence of the above four steps was repetitively performed until the film has the desired thickness. Since the film formation by ALD uses surface adsorption reaction, it has excellent step coverage and is applicable to a three-dimensional structure. When the TiO film was formed by ALD, it was in an amorphous state. The Ti material gas is not limited to TTIP. Also, the reaction gas is not limited to ozone. $H_2O$ may be used as the reaction gas. The TiO film was formed at 250° C., and may be preferably formed at 210 to 280° C. If the TiO film is formed at a temperature lower than 210° C., adsorption and oxidation reaction may not occur. If the TiO film is is formed at a temperature higher than 280° C., the Ti material gas may be decomposed in a gas phase, and thus, it is difficult to form it by ALD. In this embodiment, the thickness of a TiO film as the first dielectric film 115a is not particularly limited, but, it is preferably 0.4 to 2 nm. If the thickness of the TiO film is less than 0.4 nm, a leak current may not reduce. If the thickness of the TiO film is more than 2 nm, the EOT may increase, thereby reducing the obtained capacity of the capacitor.

Next, as described in the first test, a ZrO film as the second dielectric film 115b was formed so as to have a thickness of 6 nm at 250° C. by ALD using TEMAZ and ozone. The ZrO film formed by ALD was in a microcrystalline state. The Zr material gas is not limited to TEMAZ. The reaction gas is not limited to ozone. $H_2O$ may be used as the reaction gas. Preferably, the ZrO film is formed at 210 to 280° C. If the ZrO film is formed at a temperature lower than 210° C., reaction for forming the ZrO film may not occur. If the ZrO film is formed at a temperature higher than 280° C., the Zr material gas may be decomposed in a gas phase, and thus, it is difficult to form it by ALD.

Next, a TiN film as the first upper electrode 116a was formed at 250° C. by ALD. The TiN film was in a microcrystalline state or an amorphous state during forming it. Titanium tetrachloride ($TiCl_4$), TDMAT (tetrakis(dimethylamino)titanium: Ti[N$(CH_3)_2]_4$) and TDEAT (tetrakis(diethylamino)titanium: Ti[N$(C_2H_5)_2]_4$) may be used as the Ti material gas. The Ti material gas may be used alone or in combination. The reaction gas is provided in a plasmarized state, and ammonia, $N_2$, $N_2+NH_3$, $N_2+H_2$ may be used as the reaction gas. Further, the TiN film was formed at 250° C., but it is preferably formed at 210 to 280° C.

Next, like the lower electrode 102, a TiN film as the second upper electrode 116b was formed so as to have a thickness of 10 nm at 380 to 600° C., preferably at 450° C., by CVD, so that it is applicable to a three-dimensional structure. The TiN film was in a polycrystalline state during forming it. Thereafter, the upper electrode was processed to form a capacitor by the same method as in the first exemplary embodiment.

FIG. 12 shows the leak current property of the above capacitor. Also, FIG. 12 shows the property of a capacitor formed by changing the thickness of a TiO film as the first dielectric film 115a. Specifically, reference numeral P, Q, and R shows a leak current when the thickness of the TiO film is 0.5 nm, 1 nm, and 2 nm, respectively. Also, reference numeral F shows a leak current property when the first dielectric film 115a in FIGS. 7 to 10 is not provided.

It can be clearly understood from FIG. 12 that the first dielectric film 115a can reduce a leak current in a low electric field region (the range from −2V to 2V). When voltage +1V is applied, the leak current indicated by reference numeral F when the first dielectric film 115a is not provided is 8E-8 (A/cm$^2$), the leak current indicated by reference numeral P when the thickness is 0.5 nm is 1E-8 (A/cm$^2$), the leak current indicated by reference numeral Q when the thickness is 1 nm is 7E-9 (A/cm$^2$), and the leak current indicated by reference numeral R when the thickness is 2 nm is 7E-9 (A/cm$^2$). As the thickness increases, a leak current reduces. However, when the thickness is 2 nm (reference numeral R), the reduction of leak current is maximized. Therefore, it appears that even if the thickness further increases over 2 nm, the reduction of leak current is not expected.

When voltage −1V is applied, the leak currents indicated by reference numeral F, P, Q, and R is 6E-8 (A/cm$^2$), 2E-8 (A/cm$^2$), 1E-8 (A/cm$^2$), and 1E-8 (A/cm$^2$), respectively. As the thickness increases, a leak current reduces. However, like the leak current when voltage +1V is applied, when the thickness is 2 nm (reference numeral R), the reduction of leak current is maximized.

Although not shown in FIG. 12, if the first dielectric film 115a becomes thin to 0.3 nm, it has the same leak current as when the first dielectric film 115a is not provided (reference numeral F) in the range from −1V to 1V. Therefore, if the thickness of the first dielectric film 115a is thinner than 0.3 nm, the reduction of leak current is not expected. Based on the above results, the TiO film as the first dielectric film 115a has need to have a thickness of 0.4 nm or more in order to have the effect of reducing a leak current.

The EOT of each capacitor are 0.70 nm for reference numeral F when the first dielectric film 115a is not provided, 0.74 nm when the thickness of the TiO film is 0.5 nm (reference numeral P), 0.82 nm when the thickness of the TiO film is 1.0 nm (reference numeral Q), and 0.89 nm when the thickness of the TiO film of 2.0 nm (reference numeral R). The obtained results are that as the thickness of a TiO film as the first dielectric film 115a increases, the EOT monotonically increases. If the thickness of the TiO film is over 2.0 nm, the EOT exceeds 0.9 nm. Therefore, capacitor including such TiO film is not applicable to a high-integrity memory device having an F value of 40 nm or less that is required to have EOT of 0.9 nm or less. Accordingly, the thickness of the TiO film as the first dielectric film 115a, suitable for the present invention is preferably 0.4 nm or more in consideration of the reduction of leak current and 2.0 nm or less in consideration of obtaining an adequate EOT.

Based on the above results that as the thickness of a TiO film as the first dielectric film 115a increases, the EOT monotonically increases, the TiO film functions as a dielectric film. In this embodiment, if a TiO film as the first dielectric film 115a has a thickness of 1 nm or more, it is converted into a polycrystalline state. However, if the TiO film has a thickness of 0.8 nm or less, it is maintained in an amorphous state, and thus, is not crystallized.

Therefore, if the thickness of the first dielectric film 115a is 0.8 nm or less, a ZrO film as the second dielectric film 115b and a TiN film as the first upper electrode 116a are converted into a polycrystalline state, and the first dielectric film 115a is not crystallized when the second upper electrode 116b is formed by heat-treatment. If the thickness of the first dielectric film 115a is 1.0 nm or more, a TiO film as the first dielectric film 115a, a ZrO film as the second dielectric film 115b, and a TiN film as the first upper electrode 116a are converted into a polycrystalline state when the second upper electrode 116b is formed by heat-treatment. Also, if the thickness of the first dielectric film 115a is over 0.8 nm and less than 1 nm, an amorphous TiO film and a polycrystalline TiO film are present together.

In this embodiment, by forming the second upper electrode 116b at 450° C., the already formed second dielectric film 115b was converted from a microcrystalline ZrO film to a polycrystalline ZrO film and the first upper electrode 116a was converted from a microcrystalline or amorphous TiN film to a polycrystalline TiN film. Also, the first dielectric film 115a is an amorphous TiO film in the thickness range of 0.4 to 0.8 nm and is a polycrystalline TiO film in the thickness range of 1 to 2 nm.

As a result, in this embodiment, if a capacitor is configured to comprise a first dielectric film 115a (TiO film) having a thickness of 0.4 to 0.8 nm, it further comprises a lower electrode 102 made of a polycrystalline TiN film, a first dielectric film 115a made of an amorphous TiO film, a second dielectric film 115b made of a polycrystalline ZrO film, a first upper electrode 116a made of a polycrystalline TiN film, and a second upper electrode 116b made of a polycrystalline TiN film. Also, if a capacitor is configured to comprise a first dielectric film 115a (TiO film) having a thickness of 1 to 2 nm, it further comprises a lower electrode 102 made of a polycrystalline TiN film, a first dielectric film 115a made of a polycrystalline TiO film, a second dielectric film 115b made of a polycrystalline ZrO film, a first upper electrode 116a made of a polycrystalline TiN film, and a second upper electrode 116b made of a polycrystalline TiN film.

In other words, the capacitor comprises a lower electrode 102 connected to in a conductive region in a semiconductor substrate 101, a first dielectric film 115a contacting with the lower electrode 102 and covering the lower electrode 102, a second dielectric film 115b contacting with the first dielectric film 115a and covering the first dielectric film 115a, and an upper electrode contacting with the second dielectric film 115b and covering the second dielectric film 115b, wherein the upper electrode comprises a first upper electrode 116a including a polycrystalline titanium nitride film and contacting with the dielectric film, and a second upper electrode 116b including a polycrystalline titanium nitride film laminated on the first upper electrode 116a.

FIG. 13 explains the effect of a first upper electrode 116a in this embodiment. Reference numeral S in FIG. 13 indicates a leak current property after heat treatment is performed for 10 minutes under nitrogen atmosphere of 450° C., between a TiO film having a thickness of 0.5 nm as a first dielectric film 115a and forming a TiN film as a first upper electrode 116a. Reference numeral P in FIG. 13 is the same as reference numeral P in FIG. 12 and indicates the results of heat treatment at the time of forming a second upper electrode 116b after forming the TiN film as the first upper electrode 116a. As clearly shown in FIG. 13, since in reference numeral S, the heat treatment is performed before forming a TiN film as the first upper electrode 116a, the leak current increases in comparison to the leak current of reference numeral P. FIG. 13 also suggests that cracks begin to be generated in a ZrO film, which will be the second dielectric film 115b.

Also, FIG. 13 shows the results of heat treatment at 450° C. As in the first exemplary embodiment, in this embodiment, a leak current increases by heat treatment at 350° C. However, a leak current does not increase by heat treatment at 300° C. Therefore, when capacitor of this embodiment is formed, after forming a microcrystalline ZrO film as a dielectric film, until the first upper electrode (TiN film) as a protection film is finally formed, it is significant to maintain the process temperature not exceeding 70° C. as compared to the temperature that the microcrystalline ZrO film is formed by ALD, and the process temperature is preferably maintained at 300° C. or less. In this case, at least the dielectric film (microcrystalline ZrO film) contacting with the upper electrode (TiN film) is formed by atomic layer deposition (ALD) at a first temperature. A first titanium nitride film (the first upper electrode; TiN film) is formed in contact with the dielectric film (microcrystalline ZrO film) at a second temperature that is greater than the first temperature by not more than 70° C. As a result, the leak current property is improved. In other words, A-B is preferably 70° C. or less, wherein A is temperature for forming the first titanium nitride film and B is temperature for forming the dielectric film by the ALD.

(Third Exemplary Embodiment)

Figure 14:
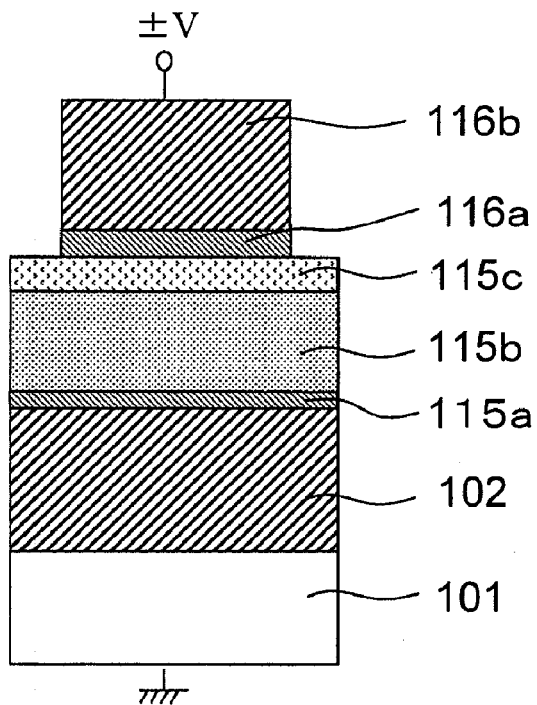
FIG. 14A is a schematic cross sectional view of a capacitor included in a semiconductor memory device according to the third exemplary embodiment.
FIG. 14B is flowsheet of a method for manufacturing the capacitor in FIG. 14A.
Figure 15:
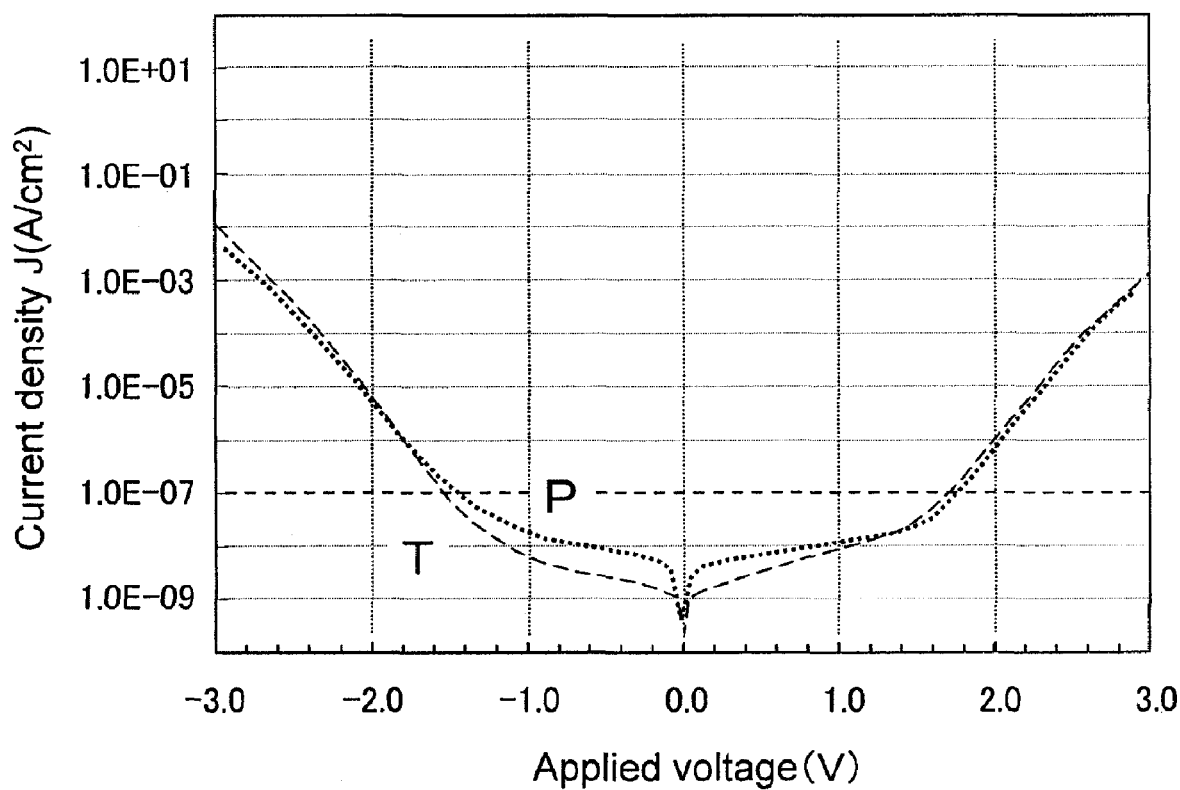
FIG. 15 is a graph showing the leak current property of the capacitors in FIGS. 11 and 14A.

This embodiment will explain a capacitor comprising a ZrO film as a dielectric film which is formed by two phases, with reference to FIGS. 14 and 15. In this process, a first microcrystalline ZrO film was formed and then heat-treated to polycrystallize the microcrystalline ZrO film. A second microcrystalline ZrO film was formed on the first microcrystalline ZrO film, and then a TiN film as a first upper electrode was formed on the second microcrystalline ZrO film by lamination. The second microcrystalline ZrO film and the microcrystalline or amorphous TiN film as the first upper electrode were converted into polycrystalline films by heat-treatment at the time of forming a second upper electrode.

FIG. 14A shows the capacitor in this embodiment. FIG. 14A shows a capacitor on a silicon single crystalline semiconductor substrate 101, comprising a lower electrode 102 made of a polycrystalline TiN film, a first dielectric film 115a made of an amorphous TiO film having a thickness of 0.5 nm, a second dielectric film 115b made of a polycrystalline ZrO film having a thickness of 5 nm, a third dielectric film 115c made of a polycrystalline ZrO film having a thickness of 1 nm, a first upper electrode 116a made of a polycrystalline TiN film having a thickness of 1 nm formed on the third dielectric film 115c, and a second upper electrode 116b made of a polycrystalline TiN film formed on the first upper electrode 116a.

The capacitor in this embodiment is different from the capacitors in the first and second exemplary embodiments in that the capacitor comprises a triple-layered dielectric film including a first dielectric film 115a, a second dielectric film 115b and a third dielectric film 115c. A ZrO film made of the same material as the second dielectric film 115b may be used as the third dielectric film 115c. Also, unlike the second dielectric film 115b, the third dielectric film 115c may be made of a hafnium oxide film or a tantalum oxide film. If the second and third dielectric films 115b, 115c are made of the same material, a ZrO film, they are combined. If such is the case, the capacitor in this embodiment is substantively the same as the capacitor in the second exemplary embodiment in FIG. 11.

A method for manufacturing the capacitor in FIG. 14 will be explained with reference to FIG. 14B below.

(1) Forming a Lower Electrode

A semiconductor substrate 101 was positioned in a TiN film forming apparatus, and a polycrystalline TiN film as a lower electrode 102 was formed on the semiconductor substrate 101 by CVD using $TiCl_4$ and $NH_3$ as reaction gas, so that it is applicable to a three-dimensional structure. The TiN film was formed so as to have a thickness of 10 nm at 450° C. The TiN film was in a polycrystalline state during forming it. After forming the TiN film, it was taken out from the TiN film forming apparatus.

(2) Forming a TiO Film as a First Dielectric Film

A TiO film 115a as a first dielectric film was formed according to the same process as the second exemplary embodiment (3) Forming a ZrO Film as a Second Dielectric Film A ZrO film 115b as a second dielectric film was formed according to the same process as the second exemplary embodiment.

(4) Heat-Treatment

The second dielectric film 115b made of a ZrO film having a thickness of 5 nm was formed by repeating a series of steps predetermined times. Thereafter, the temperature was raised to 380° C., and the ZrO film was heat-treated for 10 minutes under oxygen atmosphere while the semiconductor substrate 101 was maintained in the same ALD film forming apparatus. Thereafter, the temperature was raised to 450° C. and the ZrO film was further heat-treated for 10 minutes under nitrogen atmosphere. At the time of second heat treatment, the ZrO film as a second dielectric film 115b was polycrystallized, and cracks were generated as shown in FIG. 5. The TiO film as a first dielectric film 115a was maintained in an amorphous state.

(5) Forming a ZrO Film as a Third Dielectric Film

After performing the above heat treatment, the temperature was reduced to 250° C. and a ZrO film as a third dielectric film 115c was formed on the surface of the second dielectric film where cracks were generated. The ZrO film was formed so as to have a thickness of 1 nm at 250° C. by ALD using TEMAZ as Zr material gas and ozone as reaction gas. The ZrO film 115c formed by ALD was in a microcrystalline state.

(6) Forming a TiN Film as a First Upper Electrode

After forming the ZrO film as a third dielectric film 115c, a TiN film as a first upper electrode 116a was formed while the semiconductor substrate 101 was maintained in the same ALD film forming apparatus. $TiCl_4$, TDMAT tetrakis(dimethylamino)titanium: $Ti[N(CH_3)_2]_4$), TDEAT (tetrakis(diethylamino)titanium: $Ti[N(C_2H_5)_2]_4$) may be used as Ti material gas. The TiN film was formed so as to have a thickness of 1 nm at 250° C. by ALD using ozone as reaction gas. The TiN film 116a formed by ALD was in a microcrystalline state.

(7) Forming a Second Upper Electrode

A TiN film as a second upper electrode was formed according to the same process as the second exemplary embodiment.

Reference numeral T in FIG. 15 indicates a leak current property of the capacitor formed by the above method. Also, reference numeral P in FIG. 15 is the same as reference numeral P in FIG. 12. As mentioned above, a first microcrystalline ZrO film as the second dielectric film 115b was formed, and then heat treated to polycrystallize the ZrO film. Next, a second microcrystalline ZrO film as the third dielectric film 115c was formed on the second dielectric film 115b. A TiN film as a first upper electrode was formed on the third dielectric film 115c by laminating, and then the second microcrystalline ZrO film and the amorphous TiN film as the first upper electrode were converted into polycrystalline films by heat-treatment at the time of forming a second upper electrode. A capacitor formed by above method has a very low leak current which is substantially equal to that of reference numeral P.

In this embodiment, after forming a first microcrystalline ZrO film as the second dielectric film 115b, in addition to heat-treatment for 10 minutes at 380° C. under oxygen atmosphere, the resulting structure is further heat-treated for 10 minutes at 450° C. under nitrogen atmosphere. Although not shown in FIG. 15, the same effect can be achieved only by heat-treatment for 10 minutes at 450° C. under nitrogen atmosphere.

As shown in FIG. 13 as one example, if the structure in this embodiment was heat-treated for 10 minutes at 450° C. under nitrogen atmosphere before forming the first upper electrode 116a, a leak current increased. However, in this embodiment shows, a second microcrystalline ZrO film as the third dielectric film 115c was formed after crystallizing the first microcrystalline ZrO film as the second dielectric film 115b by heat-treatment. As a result, it is possible to avoid the increase of leak current. In this embodiment, the thickness of the first microcrystalline ZrO film was 5 nm and the thickness of the second microcrystalline ZrO film was 1 nm. As mentioned above, if an upper electrode was formed after heat-treatment of a single-layered ZrO film having a thickness of 6 nm at 450° C., a leak current sharply increased, as shown in reference numeral D in FIG. 3. It is supposed that a leak current increases due to cracks caused by the crystal growth shown in FIG. 4.

In this embodiment, the first microcrystalline ZrO film was formed and then heat-treated at 450° C., to generate cracks in the first polycrystalline ZrO film as the second dielectric film. However, thereafter, the second microcrystalline ZrO film was formed on the first polycrystalline ZrO film, so that the second microcrystalline ZrO film filled up the cracks in the first polycrystalline ZrO film to eliminate the cracks. Also, after forming the second microcrystalline ZrO film 115c and the first upper electrode 116a, the second upper electrode 116b was formed at 450° C. Therefore, the first upper electrode 116a functions as a protection film of the second microcrystalline ZrO film 115c. Accordingly, when the second upper electrode 116b was formed at 450° C., it is possible to avoid the generation of new cracks in the second microcrystalline ZrO film as the third dielectric film 115c.

Next, EOTs obtained by the capacitor in this embodiment will be explained below. With respect to the capacitor in this embodiment, the first microcrystalline ZrO film as the second dielectric film 115b was formed and heat-treated for 10 minutes at 380° C. under oxygen atmosphere followed by heat-treatment for 10 minutes at 450° C. under nitrogen atmosphere. This capacitor has an EOT of 0.67 nm.

Also, although not shown in FIG. 15, a sample heat-treated only for 10 minutes at 450° C. under nitrogen atmosphere had the same leak current as reference numeral T and has an EOT of 0.71 nm. A sample that was not heat-treated after forming the first microcrystalline ZrO film and before forming the second microcrystalline ZrO film had an EOT of 0.74 nm. Furthermore, a capacitor which includes a single-layered ZrO film having a thickness of 6 nm indicated by reference numeral P in FIG. 15 has an EOT of 0.73 nm. In other words, preferably, a ZrO film is preliminarily heat-treated before heat-treatment at the time of forming an upper electrode, in terms of thinning of EOT. Particularly, it is preferable to perform heat-treatment under oxidizing atmosphere, because heat-treatment under oxidizing atmosphere promotes impurity elimination in the ZrO film and improves a dielectric constant of the ZrO film. However, if heat-treatment under oxidizing atmosphere is performed at a very high temperature, there is a problem that a lower electrode is oxidized by the diffusion of an oxidant. Therefore, it is preferable to perform heat-treatment at 350 to 380° C. If heat-treatment is performed at a temperature lower than 350° C., the above effects resulting from heat-treatment may not be achieved sometimes.

As mentioned above, the first microcrystalline ZrO film having a thickness of 5 nm as the second dielectric film 115b was formed and then heat-treated. As a result, the first microcrystalline ZrO film was polycrystallized and cracks were generated. However, portions other than the cracks in the ZrO film are densified, thereby improving dielectric constant. In this state, the second microcrystalline ZrO film having a thickness of 1 nm as the third dielectric film 115c was formed on the surface of the first polycrystalline ZrO film, so that the second microcrystalline ZrO film filled up cracks generated in the first polycrystalline ZrO film as the second dielectric film 115b, to eliminate the cracks. Next, after forming the third dielectric film 115c and the first upper electrode 116a, the second upper electrode 116b was formed at 450° C. Therefore, the first upper electrode 116a functions as a protection film of the second microcrystalline ZrO film as the third dielectric film 115c. Accordingly, it is possible to avoid the generation of new cracks in the second microcrystalline ZrO film as the third dielectric film 115c, when forming the second upper electrode 116b at 450° C. As a result, according to the method of this embodiment, a low leak current level can be maintained and EOT can be reduced. Also, as described below, the method of this embodiment can inhibit the degradation of leak current caused by relatively long-term heat-treatment of the dielectric film 115 after forming a TiN film as the second upper electrode 116b.

In this embodiment, the thickness of the first microcrystalline ZrO film, as the second dielectric film 115b is not limited to 5 nm, and the thickness of the second microcrystalline ZrO film as the third dielectric film 115c is not limited to 1 nm. In order to densify the ZrO film, it is preferable to make the second microcrystalline ZrO film thinner and make the first microcrystalline ZrO film thicker. However, in order that the second microcrystalline ZrO film fill up and eliminate cracks generated in the first microcrystalline ZrO film, the second microcrystalline ZrO film is required to have a thickness of at least 1 nm. Also, as mentioned above, in order to have the EOT of 0.9 nm or less, the thickness of the entire ZrO film is preferably 7.0 nm or less. Therefore, in the capacitor in this embodiment, preferably, a first upper electrode 116a has is a thickness of 1 to 2 nm, a TiO film as a first dielectric film 115a has a thickness of 0.4 to 0.8 nm and a ZrO film as a third dielectric film 115c has a thickness of 1 to 1.5 nm. Therefore, it is possible to select the thickness of a ZrO film as a second dielectric film 115b so that the thickness of the entire ZrO film is in the range from 5 to 7 nm.

This embodiment comprises:

forming a lower electrode made of a titanium nitride film on a semiconductor substrate;

forming a second amorphous titanium oxide film as a first dielectric film on a surface of the lower electrode;

forming a first microcrystalline zirconium oxide film on a surface of the second amorphous titanium oxide film;

converting at least the first microcrystalline zirconium oxide film into a second dielectric film made of a polycrystalline zirconium oxide film by a heat-treatment;

forming a third microcrystalline dielectric film on a surface of the second dielectric film;

forming a first titanium nitride film on a surface of the third microcrystalline dielectric film at a temperature that the secondary crystal grain growth of the third dielectric film does not occur;

converting the first titanium nitride film into a first upper electrode comprising a polycrystalline titanium nitride film, and converting the third microcrystalline dielectric film into a third polycrystalline dielectric film by a heat-treatment, after forming the first titanium nitride film; and forming a second upper electrode comprising a polycrystalline titanium nitride film on a surface of the first upper electrode.

(Fourth Exemplary Embodiment)

Figure 16:
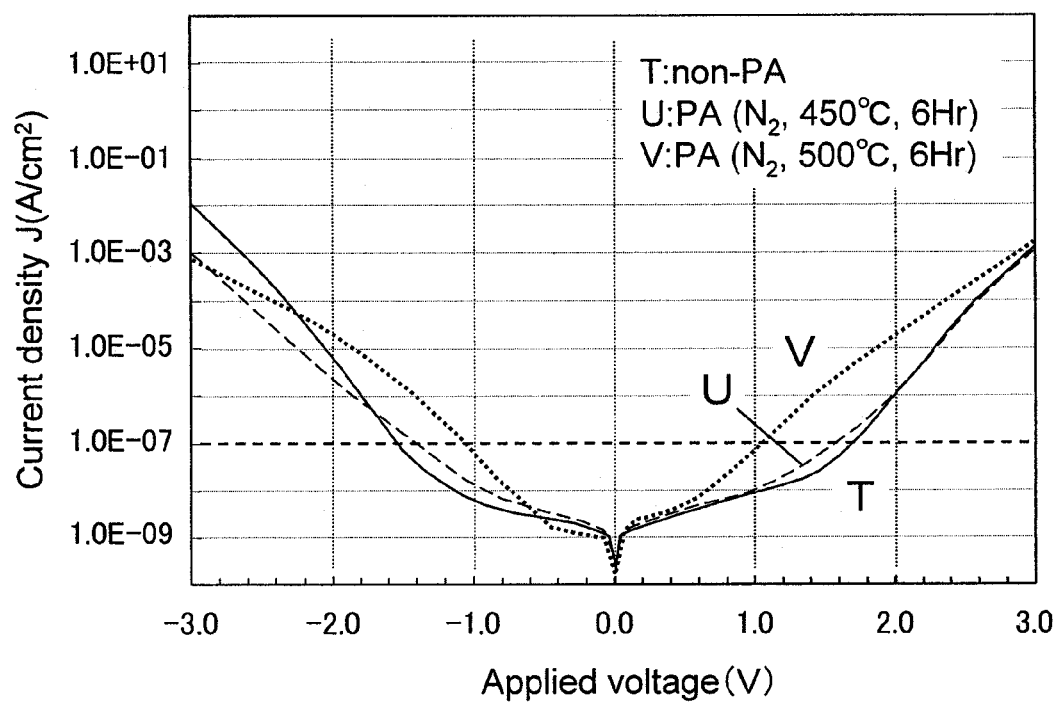
FIG. 16 is a graph explaining the effect of post-annealing on leak current property.

This embodiment will explain the results of post-annealing (PA) of the capacitor formed according to the method in the third exemplary embodiment with reference to FIG. 16.

As mentioned above, as the integrity of a semiconductor memory device improves, each memory cell is miniaturized. Therefore, it is necessary to manufacture a three-dimensional capacitor. In this case, the method peculiar to the three-dimensional structure is required. For example, an additional third upper electrode may be formed on the second upper electrode 116b according to the first to third exemplary embodiments. During such forming, for example, there may be heat load for 6 hours at 500° C. at maximum. In this case, the capacitor according to the first to third exemplary embodiments is further heat-treated. Therefore, a three-dimensional capacitor requiring a third upper electrode has need to have resistance to such heat-treatment.

Reference numeral T in FIG. 16 is the same as reference numeral T in FIG. 15 and indicates a leak current property when PA was not performed. Reference numeral U indicates a leak current property when heat-treatment was performed for 6 hours at 450° C. under nitrogen atmosphere. Reference numeral V indicates a leak current property when heat-treatment was performed for 6 hours at 500° C. under nitrogen atmosphere. In addition to the heat-treatment under nitrogen atmosphere, each sample was heat-treated for 2 hours at 450° C. under hydrogen atmosphere, and evaluated, but, there was no difference from the results in FIG. 16. Accordingly, it was found that the heat-treatment under nitrogen atmosphere had an influence on the leak current property.

It is obvious from FIG. 16 that reference numeral U indicates heat-treatment at 450° C. resulted in a slight increase of leak current in a low electric field, but there was no significant change in the range between −1V and 1V. The EOT of this sample is 0.68 nm, and thus, there is no significant difference from the EOT of reference numeral U, 0.67 nm. Therefore, it has sufficient resistance to PA at 450° C. Although not shown in FIG. 16, the capacitor comprising a single-layered ZrO film in the third exemplary embodiment has the above resistance and a TZT structure has resistance to PA at 450° C. Reference numeral V which heat-treatment is performed at 500° C. has a much higher leak current than reference numeral T which PA is not performed. However, even in this case, leak current is 1E-7 (A/cm$^2$), which is sufficiently of practical use between −1V and +1V. The EOT of this sample is 0.75 nm.

In the third exemplary embodiment, a first microcrystalline ZrO film as a second dielectric film 115b was heat-treated up to 450° C. at a maximum. Therefore, it is supposed that the first ZrO film has sufficient density with respect to PA at 450° C. while it has insufficient density with respect to PA at 500° C. Accordingly, it is supposed that the first microcrystalline ZrO film is preliminary heat-treated at 500° C., to improve density thereof and to have sufficient resistance to inhibit the increase of leak current with respect to PA at 500° C.

As mentioned above, a first microcrystalline ZrO film as a second dielectric film 115b was formed and preliminary heat-treated to polycrystallize the first microcrystalline ZrO film. Thereafter, a second microcrystalline ZrO film as a third dielectric film 115c and a microcrystalline or amorphous TiN film as a first upper electrode 116a were formed on the surface of the first polycrystalline ZrO film. A TiN film as a second upper electrode 116b was formed at 450° C. on the first upper electrode 116a. A low current level can be maintained, and an EOT can be reduced. In addition, it is possible to have sufficient resistance to PA. A capacitor resistant to PA is generally reliable. The capacitor formed according to the third exemplary embodiment can be used as an element of a semiconductor memory device requiring high reliability.

Also, this embodiment describes one example in which PA is performed to a TZT structure (a polycrystalline TiN film of a first upper electrode 116a/a polycrystalline ZrO film of a third dielectric film 115c/a polycrystalline ZrO film of a second dielectric film 115b/an amorphous or polycrystalline TiO film of a first dielectric film 114. However, this embodiment has also resistance to PA by providing a first upper electrode 116a in the structures described in the first to third exemplary embodiments.

Figure 17:
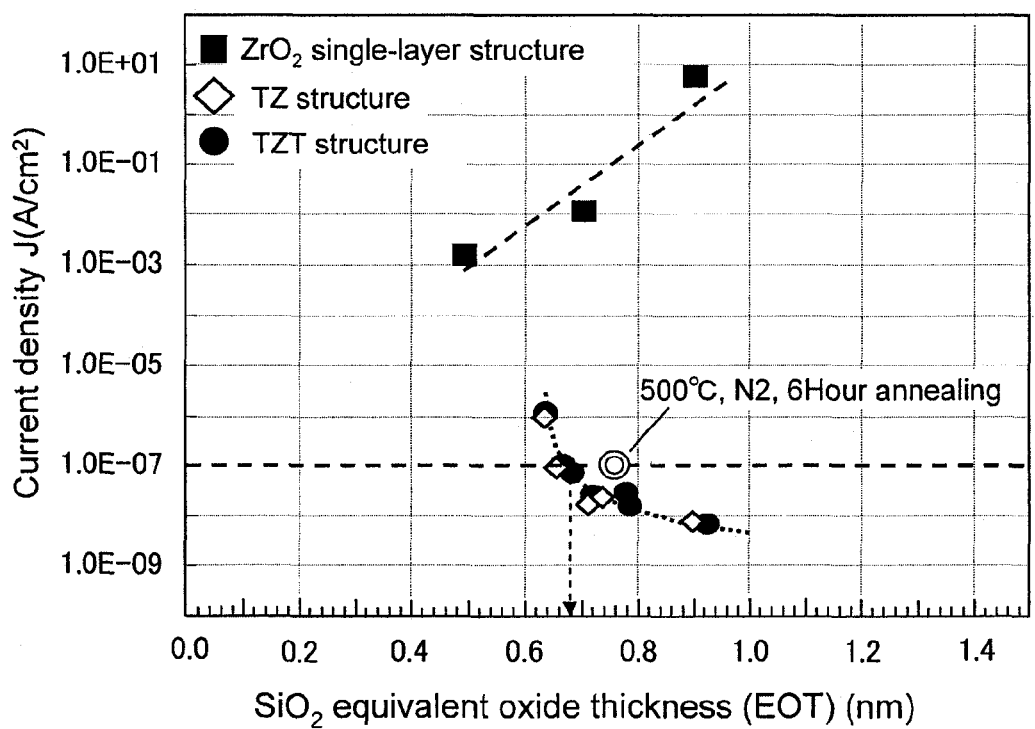
FIG. 17 is a graph showing the relationship between leak current at +1V and EOT in various capacitors.

FIG. 17 compares the relationship between EOT and leak current at +1V of the various capacitors in the aforementioned embodiments. The black square refers to a capacitor comprising a dielectric film of a single-layered ZrO film when a TiN film as a first upper electrode is not provided. The black circle refers to a capacitor comprising a TiN film as a first upper electrode, and a dielectric film made of a single-layered ZrO film. The diamond refers to a capacitor comprising a TiN film as a first upper electrode; a ZrO film of a second film or second and third dielectric films; and a TiO film as a first dielectric film. The double circle refers to the results (fourth exemplary embodiment) of PA to a TZT structure for 6 hours at 500° C. under nitrogen atmosphere It is obvious from FIG. 17 that a capacitor, in which a TiN film as a first upper electrode is not provided, has an allowable EOT and has a very high leak current, and thus, such capacitor cannot be used for a semiconductor memory device. Since a TZ structure and a TZT structure comprise at least a TiN film as a first upper electrode that functions as a protection film for preventing cracks in a ZrO film from being generated, they can maintain the EOT of 0.9 nm or less and sharply reduce a leak current to 1E-7 (A/cm$^2$) or less at +1V.

(Fifth Exemplary Embodiment)

This embodiment will explain the semiconductor memory device comprising the capacitor described in the first to fourth exemplary embodiments with reference to FIGS. 18 to 28.

First, the entire structure of a DRAM will be explained as a semiconductor memory device with reference to the schematic cross-sectional view in FIG. 18. An n-well 202 is provided on a p-type silicon substrate 201, and a first p-well 203 is provided therein. Also, a second p-well 204 is provided in a region other than the n-well 202, and is isolated from the first p-well 203 by an isolation region. For convenience, the first p-well 203 refers to a memory cell region (I), in which a plurality of memory cells are disposed, and the second p-well 204 refers to a peripheral circuit region (II).

Switching transistors 206 and 207 comprising a gate electrode of a word line as an element of each memory cell, are provided in the first p-well 203. The transistor 206 comprises a gate electrode 211, a drain 208, a source 209, and a gate insulating film 210. The gate electrode 211 includes a polycide structure in which tungsten silicide is laminated on a polysilicon, or a polymetal structure in which tungsten is laminated on a polysilicon. The transistors 207 share a source 209 and comprise a gate electrode 211, a source 209, a drain 212 and a gate insulating film 210. The transistors are covered with a first interlayer insulating film 213.

A contact hole is provided in a predetermined region of the first interlayer insulating film 213 so as to expose the source 209, and is filled up with polysilicon 214. On the surface of the polysilicon 214, a metal silicide 215 is provided. A bit line 216 comprising tungsten nitride and tungsten is provided to be connected to the metal silicide 215. The bit line 216 is covered with a second interlayer insulating film 219.

A contact hole is provided in a predetermined region of the first interlayer insulating film 213 and the second interlayer insulating film 219. The contact hole is filled up with an impurity-containing silicon, to form a silicon plug 220 connected to the drains 208 and 212 of the transistors. A conductor plug 221 made of metal is provided on the silicon plug 220.

A capacitor is formed to be connected to the conductor plug 221. A third interlayer insulating film 222a and a fourth interlayer insulating film 222b for forming a lower electrode are laminated on the second interlayer insulating film 219. After leaving the fourth interlayer insulating film 222b in a peripheral circuit region (II) and then forming a crown-shaped lower electrode 223 in a memory cell region (I), the fourth interlayer insulating film 222b is removed from the memory cell region (I). A dielectric film 224 is provided so as to cover an inner wall of the lower electrode 223 and an outer wall of the lower electrode 223 that is exposed by removing the fourth interlayer insulating film 222b.

A support film 222c is provided in contact with a portion of the upper side end of the lower electrode 223. The support film 222c is provided so as to be connected to a portion of a plurality of adjacent lower electrodes, thereby increasing mechanic strength to prevent the lower electrodes themselves from being collapsed. Since there is a space under the support film 222c, a dielectric film 224 and an upper electrode 225 are also provided on the surface of the lower electrode exposed in such space.

Figure 18:
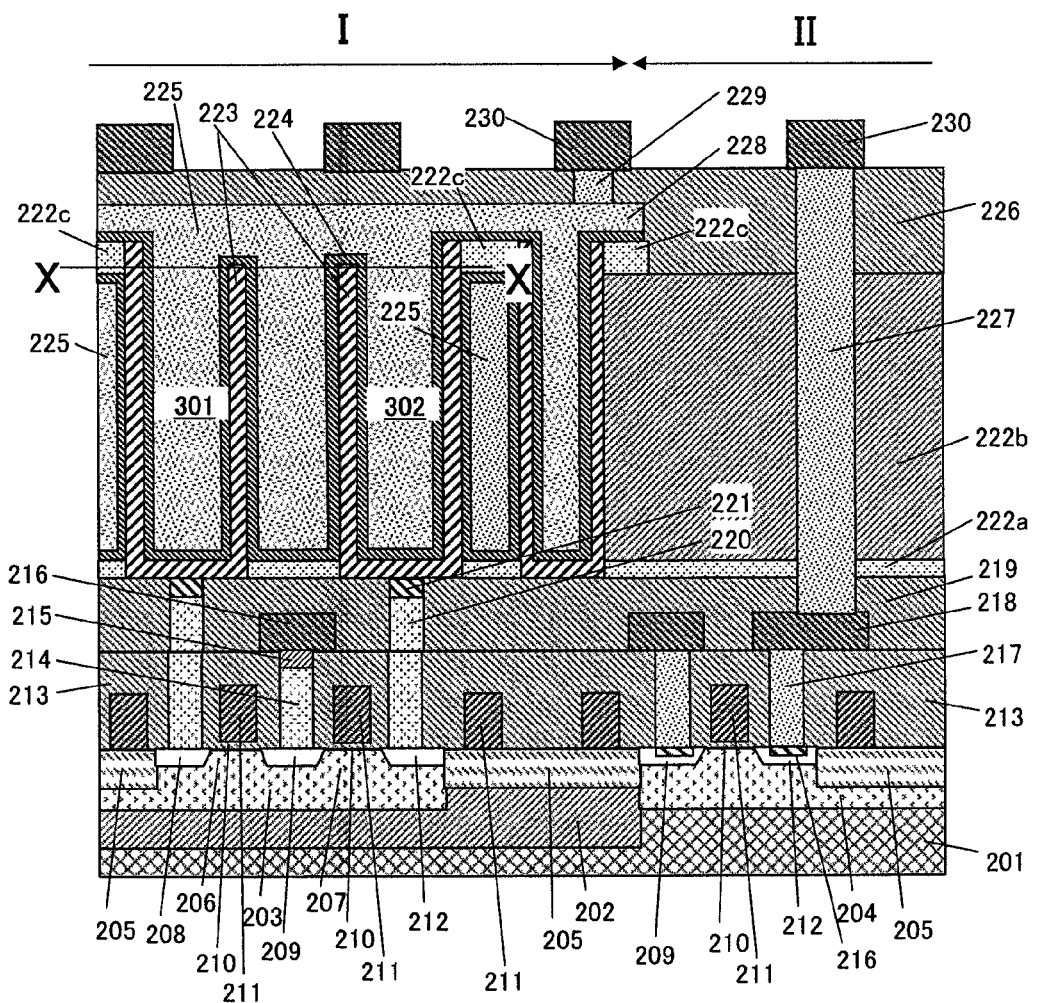
FIG. 18 is a schematic cross sectional view of the entire structure of a DRAM which is a semiconductor memory device according to the fifth exemplary embodiment.

FIG. 18 shows two capacitors 301 and 302. Titanium nitride (TiN) formed by CVD having excellent step coverage property is used as a lower electrode 223. The capacitors are covered with a fifth interlayer insulating film 226. Also, a plug material varies depending on the material of the lower electrode of the capacitor, is not limited to silicon, and may be made of metal identical to or different from the material of the lower electrode of the capacitor. Also, the detailed constitution of a dielectric film 224 and an upper electrode 225 will be explained in the following method for manufacturing the same.

In a second p-well 204, a transistor, which is included in a peripheral circuit region (II) comprises a source 209, a drain 212, a gate insulating film 210, and a gate electrode 211. A contact hole is provided in a predetermined region of the first interlayer insulating film 213 so as to the drain 212, and is filled up with metal silicide 216 and tungsten 217.

A first wiring layer 218 comprising tungsten nitride and tungsten is provided so as to be connected to tungsten 217. A portion of the first wiring layer 218 is connected to a second wiring layer 230 comprising aluminum or copper via a via metal plug 227 provided so as to penetrate a second interlayer insulating film 219, a third interlayer insulating film 222a, a fourth interlayer insulating film 222b, and a fifth interlayer insulating film 226.

Also, an upper electrode 225 of the capacitor provided in a memory cell region is lead-out to a peripheral circuit region (II) as a lead wiring 228 in some regions. The upper electrode 225 is connected to the second wiring layer 230 comprising aluminum or copper via a metal plug 229 formed in some regions of the fifth interlayer insulating film 226. A DRAM is completed by repetitively forming interlayer insulating films, contacts, and wiring layers, if necessary.

Figure 19:
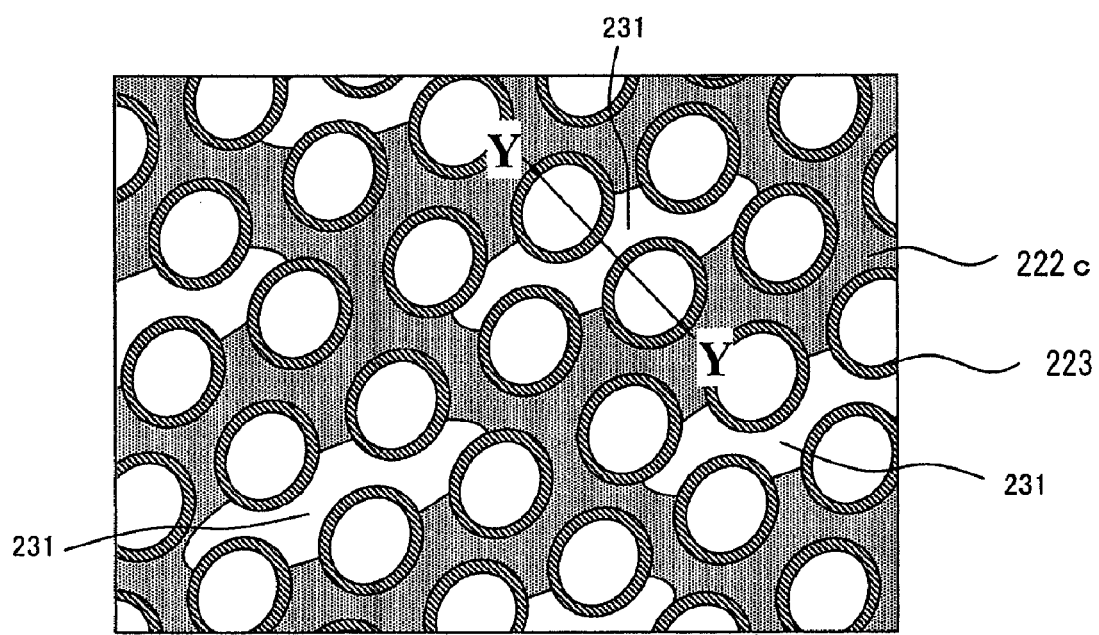
FIGS. 19 to 28 show a method for manufacturing a semiconductor memory device according to the fifth exemplary embodiment.

FIG. 19 is a plane view taken along a line X-X of the schematic cross-section view in FIG. 18. In FIG. 19, a dielectric film and an upper electrode are not shown. Also, a region taken along a line Y-Y in FIG. 19 corresponds to a region taken along a line X-X in FIG. 18. In a support film 222c covering the entire of the outer region of each lower electrode 223, a plurality of openings 231 is provided so as to deposit over a plurality of lower electrodes over the entire of the memory cell region. A portion of the outer periphery (outer side wall) of each lower electrode 223 contacts with any one of the openings 231. Generally, in the related art, as an integrity degree becomes higher, and a memory cell is miniaturized, resulting in increasing the aspect ratio (horizontal to vertical ratio) of a lower electrode of a capacitor. Therefore, if means for supporting a lower electrode are not provided, the lower electrode is collapsed in the process of forming it. However, in this embodiment, support film other than opening is continuously provided, lower electrodes are connected with each other via a support film and a length in the horizontal direction of the aspect ratio is enlarged. Therefore, the lower electrode can be prevented being collapsed.

FIG. 19 shows one example of an opening 231 that is deposited over six lower electrodes so that the opening 231 mainly is deposited over a region where capacitors 301 and 302 are opposite to each other. Therefore, like FIG. 19, FIG. 18 also shows that a support film does not contact with portions of the upper portions of capacitors 301 and 302 and a support film is not provided in a region between these upper portions.

Since a support film is provided, in order to form an upper electrode and a dielectric film on the surface of the lower electrode below the support film, it is necessary to use a film-forming method having more excellent step coverage.

Figure 20:
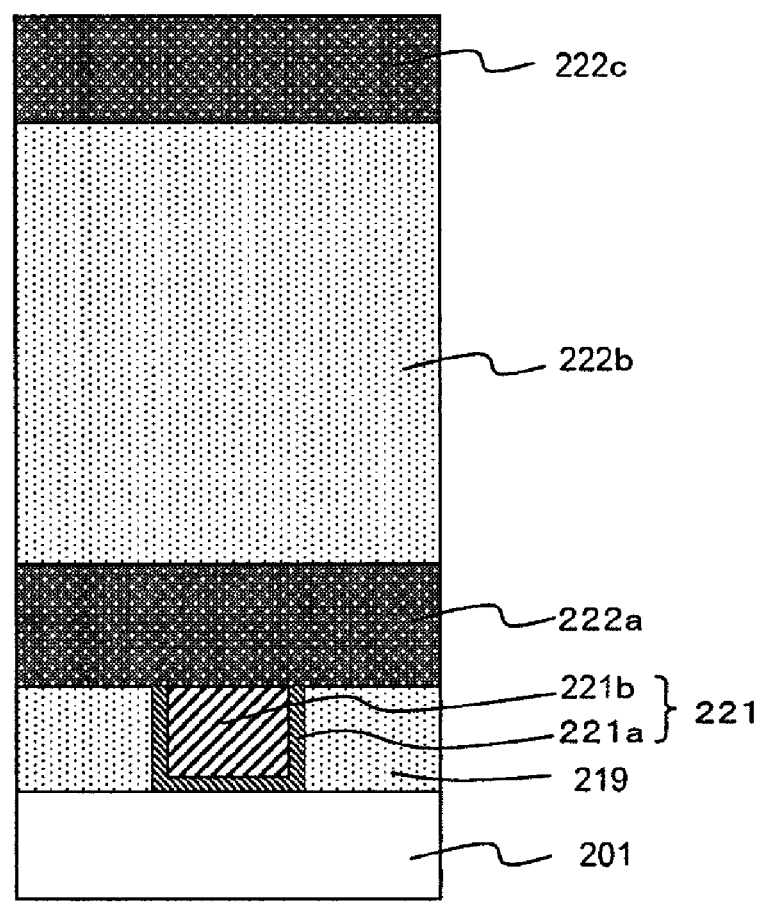

A process other than a process for manufacturing a capacitor will be omitted in a method for manufacturing a DRAM as the above semiconductor memory device, and a method for manufacturing a capacitor according to this embodiment will be explained. FIG. 20 shows a plane view of a method for manufacturing one of the capacitors in FIG. 18. For convenience, FIG. 20 does not show elements such as a transistor on a semiconductor substrate 201, a first interlayer insulating film.

First, as shown in FIG. 20, a second interlayer insulating film 219 was formed on a silicon single-crystalline semiconductor substrate 201. Thereafter, after forming a contact hole at a predetermined location, barrier metal 221a and metal 221b were formed over the entire surface of semiconductor substrate 201. Thereafter, the barrier metal 221a and metal 221b formed on the second interlayer insulating film were removed by CMP, to form a conductor plug 221. Subsequently, a third interlayer insulating film 222a made of a silicon nitride film, a fourth interlayer insulating film 222b made of a silicon oxide film, and a support film 222c made of a silicon nitride film were formed over the entire surface of semiconductor substrate 201.

Figure 21:
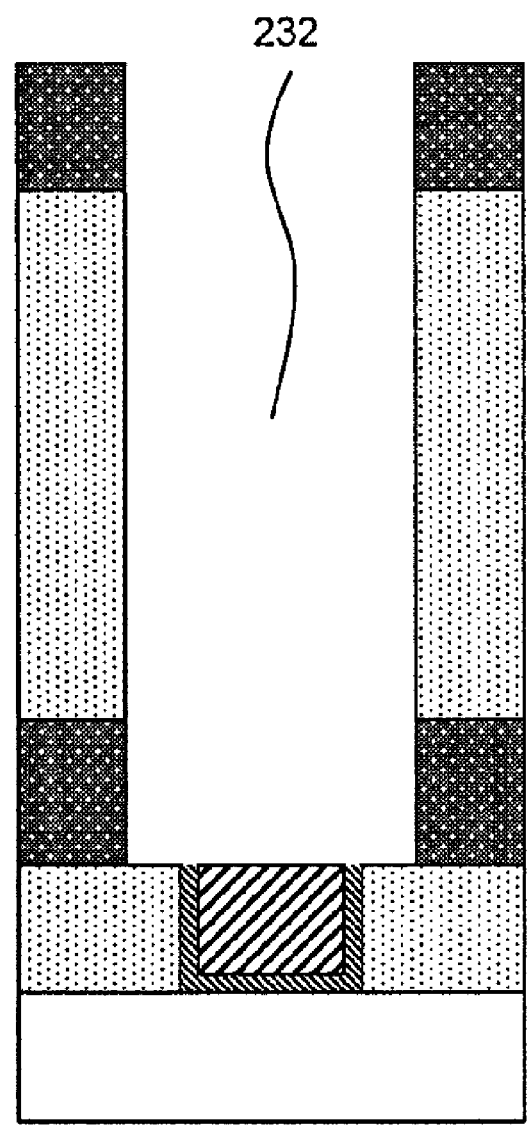

Next, as shown in FIG. 21, a cylinder hole 232 was formed in the support film 222c, fourth interlayer insulating film 222b, and third interlayer insulating film 222a by using lithography and dry etching. In a plane view, the cylinder hole was a circle having a diameter of 60 nm. Also, a distance between most adjacent cylinder holes was 60 nm. As a result, the upper surface of the conductor plug 221 was exposed at the bottom surface of the cylinder hole.

Figure 22:
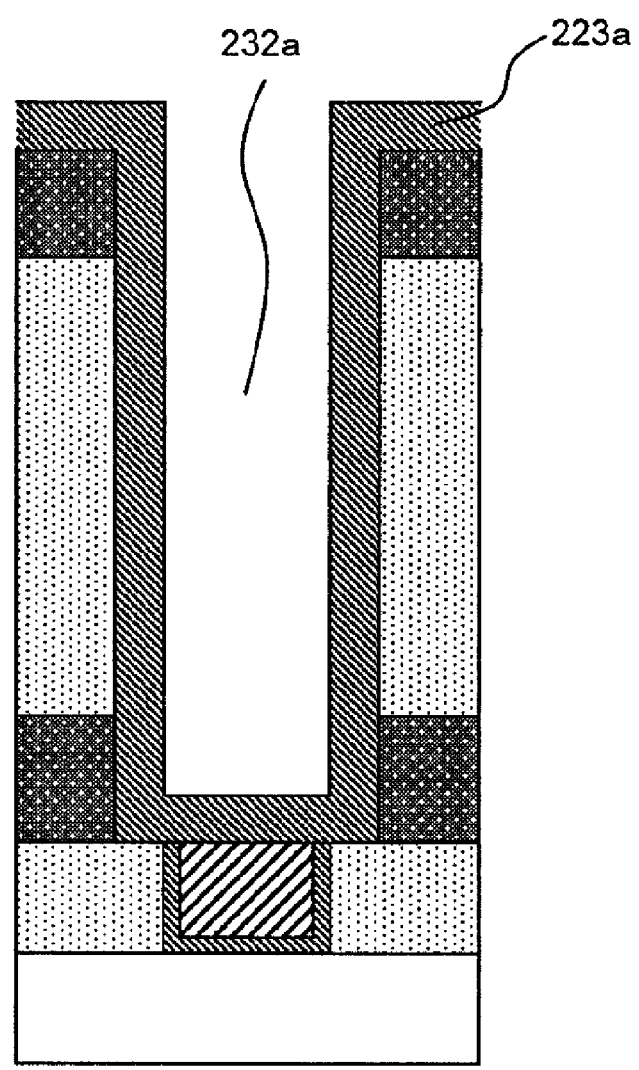

Next, as shown in FIG. 22, a TiN film 223a as a lower electrode material of a capacitor was formed on the entire surface including an inner surface of the cylinder hole 232. The TiN film may be formed at 380 to 650° C. by CVD using $TiCl_4$ and $NH_3$ material gas. In this embodiment, the TiN film was formed at 450° C. The thickness of the TiN film was 10 nm. Also, the TiN film may be formed by ALD using the above material gas. By forming the TiN film 223a, a new cylinder hole 232a was also formed.

Figure 23:
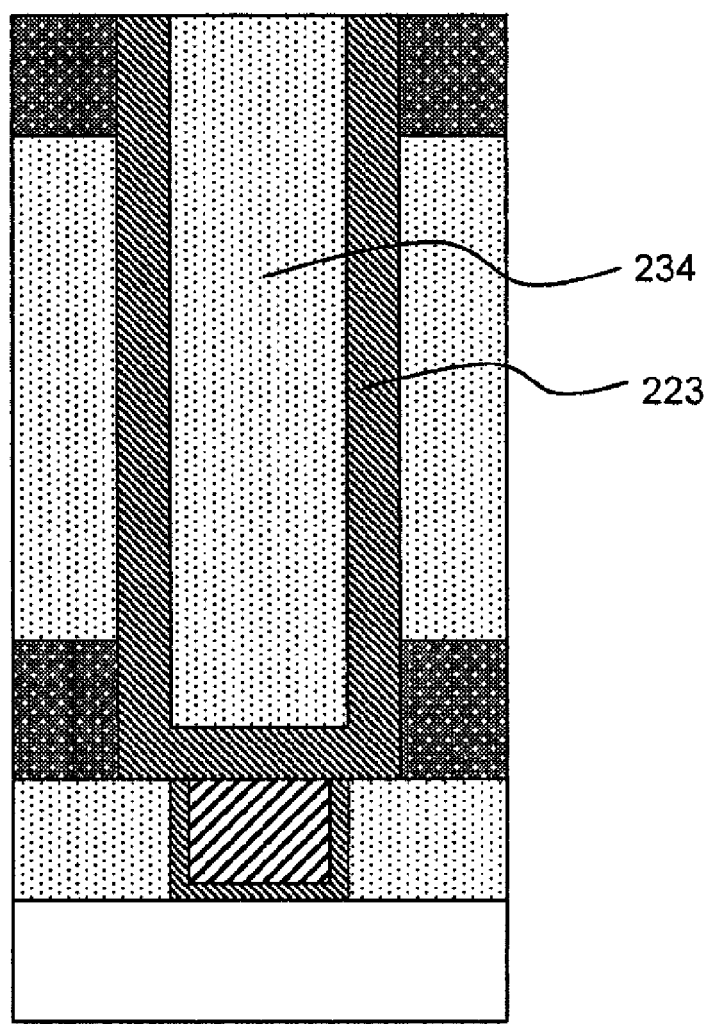

Next, as shown in FIG. 23, a protection film 234 such as a silicon oxide film was formed on the entire surface, so as to fill up the cylinder hole 232a with the protection film 234. Thereafter, the protection film 234 and TiN film 223a formed on the support film 222c by CMP were removed to form a lower electrode 223.

Figure 24:
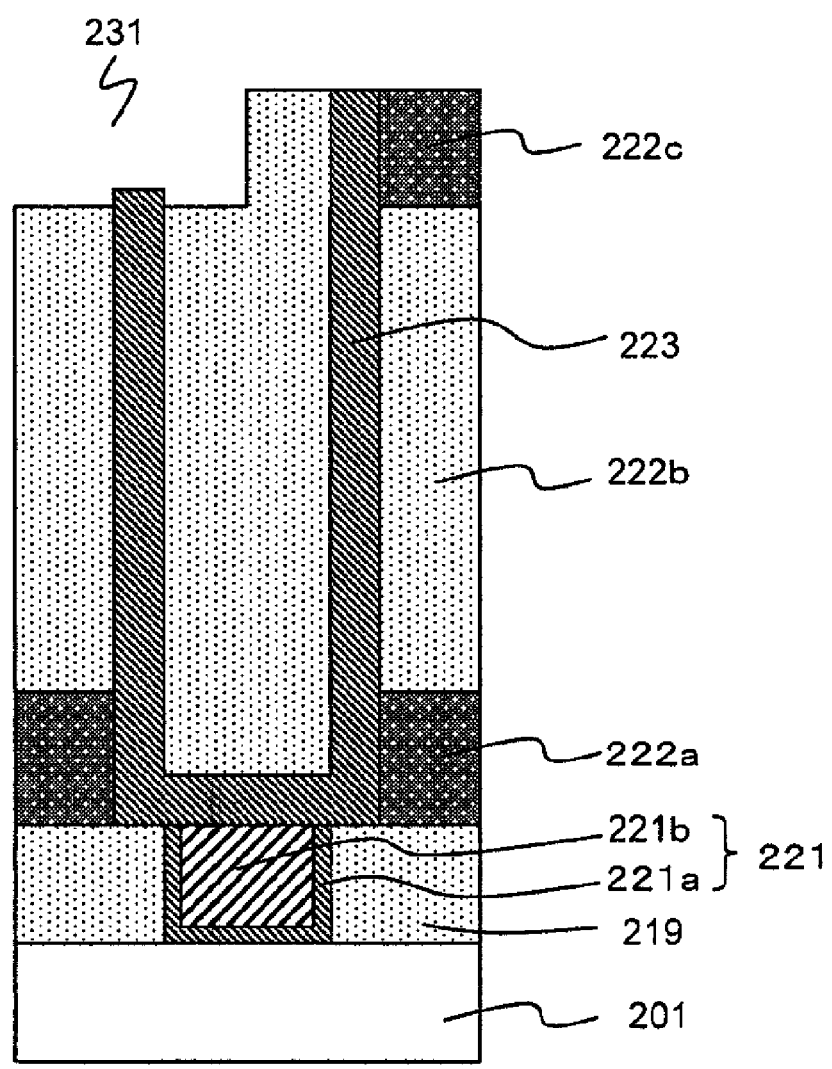

Next, as shown in FIG. 24, an opening 231 was formed in the support film 222c. As shown in the plane view of FIG. 19, the pattern of the opening 231 was formed to position over a portion of the protection film 234, a portion of the lower electrode 223, and a portion of a fourth interlayer insulating film 222b. Therefore, the support film 222c formed on the fourth interlayer insulating film 222b as well as the parts of the upper portions of the protection film 234 and lower electrode 223 were removed by dry etching for forming the opening 231.

Figure 25:
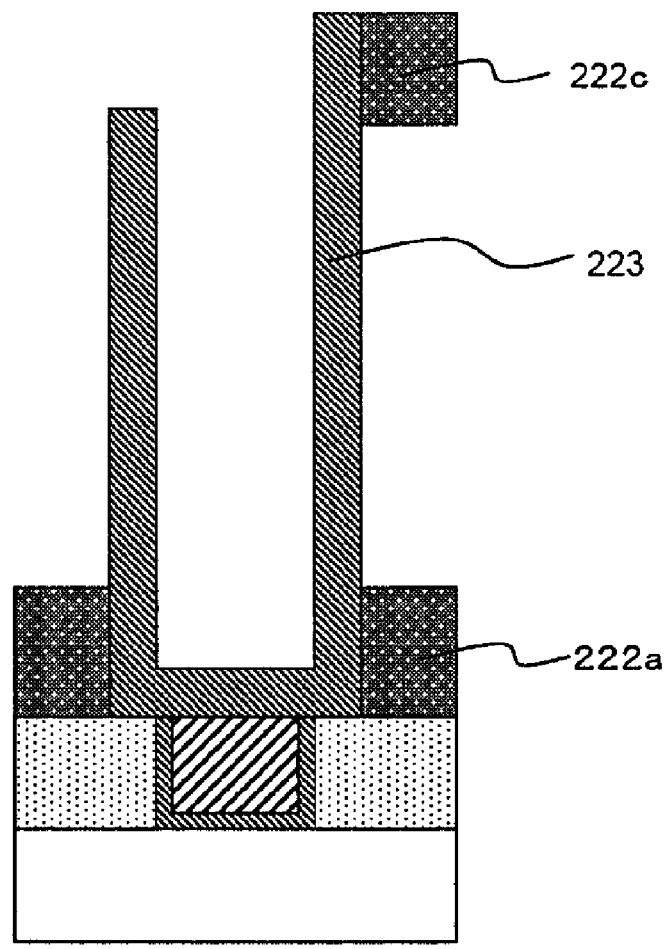

Next, as shown in FIG. 25, the fourth interlayer insulating film 222b exposed inside of the opening 231 was removed. If, for example, a hydrofluoric acid solution (HF solution) is used, the support film 222c is hardly etched because it is made of a silicon nitride film. However, the fourth interlayer insulating film 222b and protection film 234 made of a silicon oxide film were completely etched. By such etching using a solution, a silicon oxide film just below the opening 231 as well as a silicon oxide film below the support film 222c was removed. As a result, the lower electrode 223 and the support film 223c supporting the lower electrode 223 remained so that there was a space below these elements, resulting in exposing the surface of the lower electrode.

When performing such etching, the third interlayer insulating film 222a made of a silicon nitride film functioned as an etching stopper, and thus, prevented the second interlayer insulating film 219 from being etched.

Figure 26:
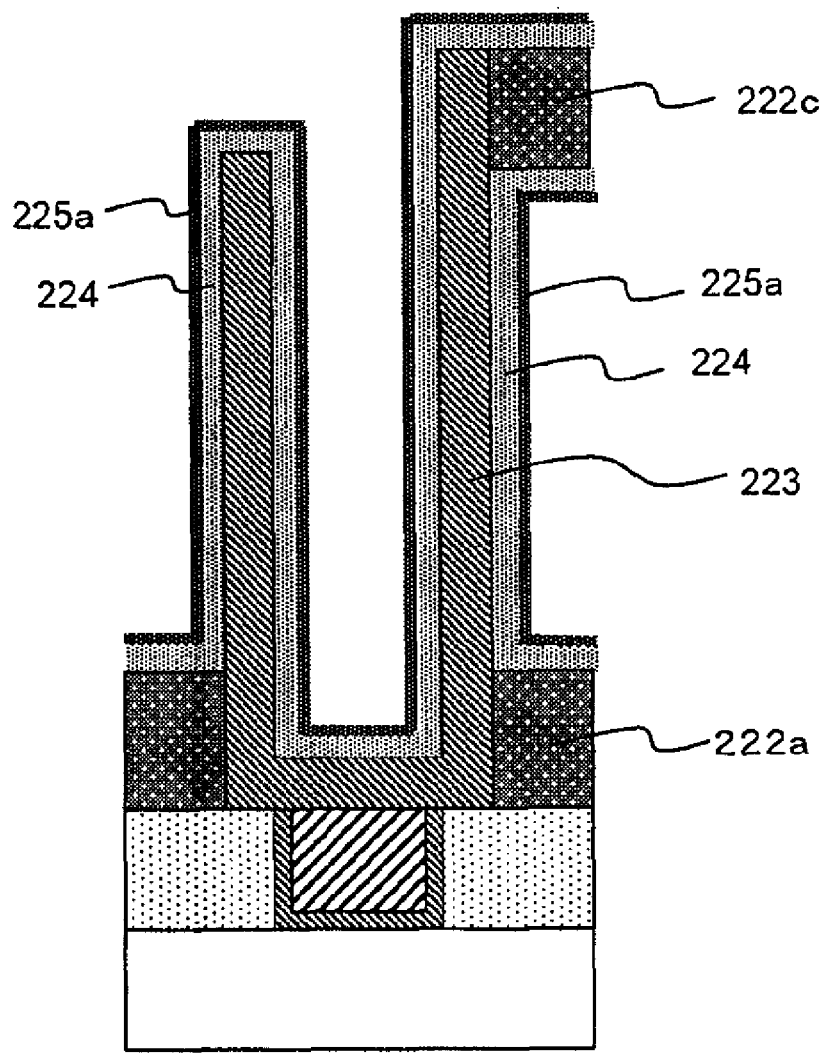

Next, as shown in FIG. 26, a TiN film as a dielectric film 224 and a first upper electrode 225a was formed. The first upper electrode 225a and dielectric film 224 may be formed to have a TZ structure according to the first exemplary embodiment or a TZT structure according to the second to fourth exemplary embodiments using ALD. Parameters of such TZ structure and TZT structure can be optimized so as to obtain desired properties. Since ALD has excellent step coverage property, a dielectric film 224 and a first upper electrode 225a may be formed in any portion of the exposed surface of the lower electrode in a space.

Figure 27:
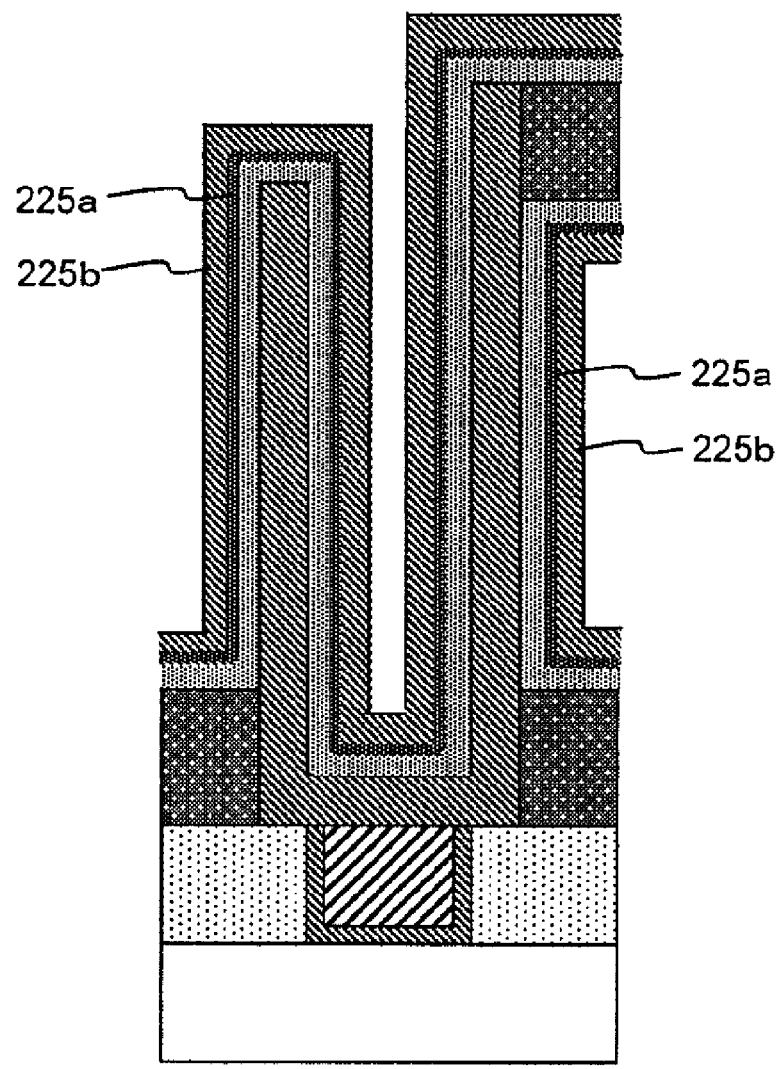

Next, as shown in FIG. 27, a TiN film as the second upper electrode 225b was formed. Like the lower electrode, the second upper electrode 225b having a thickness of 10 nm was formed at 450° C. by CVD using $TiCl_4$ and $NH_3$ material gas. Since a TiN film formed by CVD also has excellent step coverage, the second upper electrode 225b may be formed in any portion of the exposed surface of the first upper electrode 225a in a space.

When the second upper electrode 225b was formed at 450° C., the dielectric film 224 was heat-treated while it was protected by a TiN film as the first upper electrode 225a. Therefore, as mentioned in the previous embodiments, it is possible to prevent cracks from being generated in the dielectric film 224, and to prevent leak current from increasing.

Figure 28:
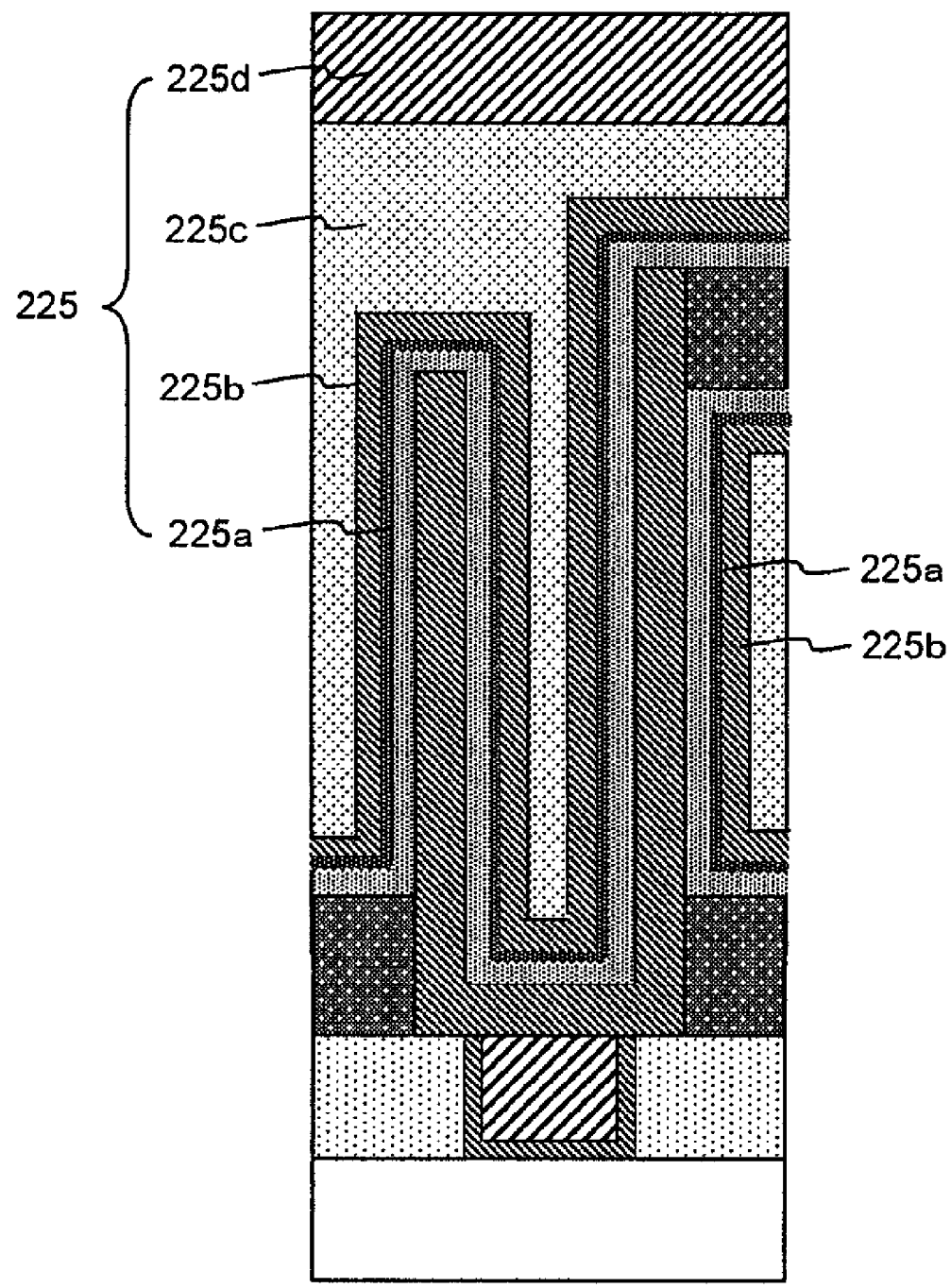

Next, as shown in FIG. 28, a boron-doped silicon germanium film (B-SiGe film) as a third upper electrode 225c was formed. When the second upper electrode 225b in FIG. 27 was formed, there was a space in some region of the resulting structure. In such state, if tungsten as a plate is formed by PVD, it is not possible to completely fill up the space, because PVD has bad step coverage property. Therefore, when a semiconductor memory device was completed, there were hollow spaces around a capacitor. Such hollow spaces resulted in the reduction of mechanic strength of the capacitor and changed the capacitor property resulting from stress by the subsequent packaging. Therefore, the objective of a B-SiGe film is to eliminate a remaining empty space by filling up them and improve the resistance of the capacitor to mechanic stress.

The B-SiGe film may be formed by CVD using germane ($GeH_4$), monosilane ($SiH_4$), and boron trichloride ($BCl_3$) as material gas. The B-SiGe film formed by such process has excellent step coverage, and thus, can fill hollow spaces. However, a temperature for forming a B-SiGe film by CVD is needed to be 420 to 500° C. In consideration of productivity, if a B-SiGe film is formed in a batch manner, the capacitor is heat-treated for approximately 6 hours. The PA in the fourth exemplary embodiment corresponds to heat-treatment is performed in this process. At the time of forming a B-SiGe film as the third upper electrode 225c, even if heat-treatment is performed at temperature of 500° C. at a maximum, it is possible to obtain an EOT and provide a capacitor having a low leak current by using the method according to the third exemplary embodiment.

After the B-SiGe film as the third upper electrode 225c was formed, in order to use it as a power supply plate covering the entire of a memory cell region, a tungsten film (W film) as a fourth upper electrode 225d was formed on the third upper electrode 225c. Since the W film is formed at 25 to 300° C. by PVD, it does not have harmful effects on the dielectric film, and the leak current in the dielectric film does not increase. As shown in FIG. 18, a fifth interlayer insulating film 226 was formed and the subsequent steps were performed, to form a semiconductor memory device comprising a DRAM.

As mentioned above, the entire structure of an upper electrode 225 is shown in FIG. 18. The detailed structure of the upper electrode 225 is shown in FIG. 28. The upper electrode 225 comprises a TiN film as a first upper electrode 225a, a TiN film as a second upper electrode 225b, a B-SiGe film as a third upper electrode, and a W film as a fourth upper electrode 225d.

Also, this embodiment explains a high-tech ultra high density DRAM and a method for manufacturing the DRAM. If a flat capacitor or a three-dimensional capacitor requiring no support film 222c for preventing collapse is used, the effect of PA at 500° C. on the leak current property reduces, because it is not necessary to form a B-SiGe.

As mentioned above, according to this embodiment, a second upper electrode was formed and heat-treated at 450° C., while a surface of ZrO film as a dielectric film was protected by a TiN film as a first upper electrode. Therefore, it is possible to prevent cracks form being generated in the ZrO film, and thus, to provide a capacitor having a low leak current while having a low EOT.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following method for manufacturing a semiconductor memory device and semiconductor memory device:

1. A method for manufacturing a semiconductor memory device including a capacitor, comprising:
   forming a lower electrode made of a titanium nitride film above a semiconductor substrate;
   forming a dielectric film on the lower electrode; and
   forming an upper electrode including a titanium nitride film on the dielectric film,
   wherein at least the dielectric film contacting with the upper electrode is formed by atomic layer deposition (ALD),
   a first titanium nitride film is formed on the dielectric film by the ALD without a heat treatment, and
   in forming the upper electrode, the first titanium nitride film is converted into a first upper electrode including a first polycrystalline titanium nitride film by a heat treatment, and a second upper electrode including a polycrystalline titanium nitride film is formed on a surface of the first upper electrode.

2. The method for manufacturing a semiconductor memory device according to the above 1,
   wherein the dielectric film is a single-layered film of zirconium oxide and is in a microcrystallite state when the dielectric film is formed by the ALD, and
   a secondary crystal grain growth of the dielectric film occurs and the dielectric film becomes a polycrystalline state, by the heat treatment in which the first titanium nitride film is converted into the first upper electrode including the first polycrystalline titanium nitride film.

3. The method for manufacturing a semiconductor memory device according to the above 1,
   wherein the dielectric film is a laminate structure in which a first dielectric film made of a titanium oxide film and a second dielectric film made of a polycrystalline zirconium oxide film are formed in this order on the lower electrode,
   the second dielectric film is in a microcrystalline state when the second dielectric film is formed by the ALD, and
   a secondary crystal grain growth of the second dielectric film occurs and the second dielectric film becomes a polycrystalline state, by the heat treatment in which the first titanium nitride film is converted into the first upper electrode including the first polycrystalline titanium nitride film.

4. The method for manufacturing a semiconductor memory device according to the above 3,
   wherein the titanium oxide film as the first dielectric film has a thickness from 0.4 nm to 2 nm.

5. The method for manufacturing a semiconductor memory device according to the above 4,
   wherein the titanium oxide film as the first dielectric film has a thickness from 0.4 nm to 0.8 nm,
   the first dielectric film is formed in an amorphous state, and the first dielectric film remains in the amorphous state after the heat treatment.

6. The method for manufacturing a semiconductor memory device according to the above 4,
wherein the titanium oxide film as the first dielectric film has a thickness from 1 nm to 2 nm,
the first dielectric film is formed in an amorphous state, and
the first dielectric film is in a polycrystalline state after the heat treatment.

7. The method for manufacturing a semiconductor memory device according to the above 3,
wherein the polycrystalline zirconium oxide film has a thickness from 5 nm to 7 nm.

8. The method for manufacturing a semiconductor memory device according to the above 1,
wherein the first polycrystalline titanium nitride film as the first upper electrode has a thickness from 1 nm to 2 nm.

9. The method for manufacturing a semiconductor memory device according to the above 1,
wherein the steps from forming the dielectric film on the lower electrode to forming the first titanium nitride film on the dielectric film are maintained at 300° C. or less.

10 The method for manufacturing a semiconductor memory device according to the above 1,
wherein the dielectric film is a laminate of a first dielectric film made of a titanium oxide film, a second dielectric film made of a polycrystalline zirconium oxide film, and a third dielectric film formed in this order on the lower electrode, and
the second dielectric film is densified by a heat treatment before forming the third dielectric film.

11. The method for manufacturing a semiconductor memory device according to the above 10,
wherein the titanium oxide film as the first dielectric film has a thickness from 0.4 nm to 2 nm.

12. The method for manufacturing a semiconductor memory device according to the above 11,
wherein the titanium oxide film as the first dielectric film has a thickness from 0.4 nm to 0.8 nm,
the first dielectric film is formed in an amorphous state, and
the first dielectric film remains in the amorphous state after the heat treatment for densifying the second dielectric film.

13. The method for manufacturing a semiconductor memory device according to the above 11,
wherein the titanium oxide film as the first dielectric film has a thickness from 1 nm to 2 nm,
the first dielectric film is formed in an amorphous state, and
the first dielectric film is in a polycrystalline state after the heat treatment for densifying the second dielectric film.

14. The method for manufacturing a semiconductor memory device according to the above 10,
wherein the third dielectric film has a thickness from 1 nm to 1.5 nm and,
a sum of the thickness of the third dielectric film and a thickness of the second dielectric film is in a range from 5 to 7 nm.

15. The method for manufacturing a semiconductor memory device according to the above 10,
wherein the first polycrystalline titanium nitride film as the first upper electrode has a thickness from 1 nm to 2 nm.

16. The method for manufacturing a semiconductor memory device according to the above 10,
wherein the third dielectric film is identical to or different from the second dielectric film.

17. The method for manufacturing a semiconductor memory device according to the above 10,
wherein the heat treatment for densifying the second dielectric film includes a heat treatment from 350 to 380° C. under oxidation atmosphere.

18. The method for manufacturing a semiconductor memory device according to the above 10,
wherein the steps from forming the third dielectric film to forming the first titanium nitride film on a surface of the third dielectric film are maintained at 300° C. or less.

19. The method for manufacturing a semiconductor memory device according to the above 1,
wherein the steps from forming the dielectric film on the lower electrode to forming the first titanium nitride film on the dielectric film are continuously performed in same film forming apparatus.

20. The method for manufacturing a semiconductor memory device according to the above 1,
wherein all the dielectric films and the first titanium nitride film as the first upper electrode are formed at 210° C. to 280° C. by the ALD.

21. The method for manufacturing a semiconductor memory device according to the above 1,
wherein in forming the second upper electrode, the polycrystalline titanium nitride film is formed at 380° C. to 600° C. by CVD.

22. The method for manufacturing a semiconductor memory device according to the above 21,
wherein in forming the second upper electrode, the first titanium nitride film as the first upper electrode is converted into a polycrystalline state by the heat treatment.

23. The method for manufacturing a semiconductor memory device according to the above 1,
wherein a $SiO_2$ equivalent oxide thickness (EOT) of the dielectric film is 0.9 nm or less.

24. The method for manufacturing a semiconductor memory device according to the above 1,
wherein the lower electrode has a three dimensional structure.

25. The method for manufacturing a semiconductor memory device according to the above 24,
wherein after forming the second upper electrode, the method further comprises forming a third upper electrode made of a boron containing silicon germanium film.

26. The method for manufacturing a semiconductor memory device according to the above 25,
wherein the boron containing silicon germanium film is formed at 400° C. to 500° C. by CVD.

27. A semiconductor memory device comprising a capacitor above a semiconductor substrate,
wherein the capacitor comprises:
a lower electrode connected to a conductive region in the semiconductor substrate;
a dielectric film contacting with the lower electrode and covering the lower electrode; and
an upper electrode contacting with the dielectric film and covering the dielectric film,
wherein the upper electrode comprises:
a first upper electrode including a polycrystalline titanium nitride film contacting with the dielectric film; and
a second upper electrode including a polycrystalline titanium nitride film laminated on the first upper electrode.

28. The semiconductor memory device according to the above 27,
wherein the dielectric film comprises a polycrystalline zirconium oxide film.

29. The semiconductor memory device according to the above 28,
wherein the polycrystalline zirconium oxide film has a thickness from 5 nm to 7 nm.

30. The semiconductor memory device according to the above 27,
wherein the dielectric film comprises:
a first dielectric film made of a titanium oxide film contacting with the lower electrode; and
a second dielectric film made of a polycrystalline zirconium oxide film formed on the first dielectric film.

31. The semiconductor memory device according to the above 30,
wherein the first dielectric film made of the titanium oxide film has a thickness from 0.4 nm to 2 nm.

32. The semiconductor memory device according to the above 31,
wherein the first dielectric film has a thickness from 0.4 nm to 0.8 nm and is the amorphous titanium oxide film.

33. The semiconductor memory device according to the above 31,
wherein the first dielectric film has a thickness from 1 nm to 2 nm and is the polycrystalline titanium oxide film.

34. The semiconductor memory device according to the above 27,
wherein a $SiO_2$ equivalent oxide thickness (EOT) of the dielectric film is 0.9 nm or less.

35. The semiconductor memory device according to the above 27,
wherein the polycrystalline titanium nitride film as the first upper electrode has a thickness from 1 nm to 2 nm.

36. The semiconductor memory device according to the above 27,
wherein the lower electrode has a three dimensional structure.

37. The semiconductor memory device according to the above 36,
wherein a third upper electrode made of a boron-containing silicon germanium film is formed on the second upper electrode.

38. The semiconductor memory device according to the above 27,
wherein when a voltage between −1V and +1V is applied to the capacitor, a leak current is 1E-7 ($A/cm^2$) or less.

What is claimed is:

1. A method for manufacturing a semiconductor memory device including a capacitor, comprising:
forming a lower electrode made of a titanium nitride film above a semiconductor substrate;
forming a dielectric film on the lower electrode; and
forming an upper electrode including a titanium nitride film on the dielectric film,
wherein at least the dielectric film contacting with the upper electrode is formed by atomic layer deposition (ALD) at a first temperature,
a first titanium nitride film is formed in contact with the dielectric film at a second temperature that is greater than the first temperature by not more than 70° C.,
in forming the upper electrode, the first titanium nitride film is converted into a first upper electrode including a first polycrystalline titanium nitride film by a heat treatment, and a second upper electrode including a polycrystalline titanium nitride film is formed on a surface of the first upper electrode.

2. The method for manufacturing a semiconductor memory device according to claim 1,
wherein the dielectric film is a single-layered film of zirconium oxide and is in a microcrystallite state when the dielectric film is formed by the ALD, and
a secondary crystal grain growth of the dielectric film occurs and the dielectric film becomes a polycrystalline state, by the heat treatment in which the first titanium nitride film is converted into the first upper electrode including the first polycrystalline titanium nitride film.

3. The method for manufacturing a semiconductor memory device according to claim 1,
wherein the dielectric film is a laminate structure in which a first dielectric film made of a titanium oxide film and a second dielectric film made of a polycrystalline zirconium oxide film are formed in this order on the lower electrode,
the second dielectric film is in a microcrystalline state when the second dielectric film is formed by the ALD, and
a secondary crystal grain growth of the second dielectric film occurs and the second dielectric film becomes a polycrystalline state, by the heat treatment in which the first titanium nitride film is converted into the first upper electrode including the first polycrystalline titanium nitride film.

4. The method for manufacturing a semiconductor memory device according to claim 3,
wherein the polycrystalline zirconium oxide film has a thickness from 5 nm to 7 nm.

5. The method for manufacturing a semiconductor memory device according to claim 1,
wherein the first polycrystalline titanium nitride film as the first upper electrode has a thickness from 1 nm to 2 nm.

6. The method for manufacturing a semiconductor memory device according to claim 1,
wherein the steps from forming the dielectric film on the lower electrode to forming the first titanium nitride film on the dielectric film are maintained at 300° C. or less.

7. The method for manufacturing a semiconductor memory device according to claim 1,
wherein the dielectric film is a laminate of a first dielectric film made of a titanium oxide film, a second dielectric film made of a polycrystalline zirconium oxide film, and a third dielectric film formed in this order on the lower electrode, and
the second dielectric film is densified by a heat treatment before forming the third dielectric film.

8. The method for manufacturing a semiconductor memory device according to claim 7,
wherein the third dielectric film has a thickness from 1 nm to 1.5 nm and,
a sum of the thickness of the third dielectric film and a thickness of the second dielectric film is in a range from 5 to 7 nm.

9. The method for manufacturing a semiconductor memory device according to claim 7,
wherein the first polycrystalline titanium nitride film as the first upper electrode has a thickness from 1 nm to 2 nm.

10. The method for manufacturing a semiconductor memory device according to claim 7,
wherein the third dielectric film is identical to or different from the second dielectric film.

11. The method for manufacturing a semiconductor memory device according to claim 7,
wherein the heat treatment for densifying the second dielectric film includes a heat treatment from 350 to 380° C. under oxidation atmosphere.

12. The method for manufacturing a semiconductor memory device according to claim 7,
wherein the steps from forming the third dielectric film to forming the first titanium nitride film on a surface of the third dielectric film are maintained at 300° C. or less.

13. The method for manufacturing a semiconductor memory device according to claim 1,
wherein the steps from forming the dielectric film on the lower electrode to forming the first titanium nitride film on the dielectric film are continuously performed in same film forming apparatus.

14. The method for manufacturing a semiconductor memory device according to claim 1,
wherein all the dielectric films and the first titanium nitride film as the first upper electrode are formed at 210° C. to 280° C. by the ALD.

15. The method for manufacturing a semiconductor memory device according to claim 1,
wherein in forming the second upper electrode, the polycrystalline titanium nitride film is formed at 380° C. to 600° C. by CVD.

16. The method for manufacturing a semiconductor memory device according to claim 15,
wherein in forming the second upper electrode, the first titanium nitride film as the first upper electrode is converted into a polycrystalline state by the heat treatment.

17. The method for manufacturing a semiconductor memory device according to claim 1,
wherein a $SiO_2$ equivalent oxide thickness (EOT) of the dielectric film is 0.9 nm or less.

18. The method for manufacturing a semiconductor memory device according to claim 1,
wherein the lower electrode has a three dimensional structure.

19. The method for manufacturing a semiconductor memory device according to claim 18,
wherein after forming the second upper electrode, the method further comprises forming a third upper electrode made of a boron containing silicon germanium film.

20. The method for manufacturing a semiconductor memory device according to claim 19,
wherein the boron containing silicon germanium film is formed at 400° C. to 500° C. by CVD.

* * * * *